(12) United States Patent  
Johnsen et al.

(10) Patent No.: US 10,284,448 B2  
(45) Date of Patent: May 7, 2019

(54) SYSTEM AND METHOD FOR USING Q_KEY VALUE ENFORCEMENT AS A FLEXIBLE WAY OF PROVIDING RESOURCE ACCESS CONTROL WITHIN A SINGLE PARTITION IN A HIGH PERFORMANCE COMPUTING ENVIRONMENT

(71) Applicant: Oracle International Corporation, Redwood Shores, CA (US)

(72) Inventors: Bjørn Dag Johnsen, Oslo (NO); Arvind Srinivasan, San Jose, CA (US); Brian Manula, Oslo (NO)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 15/416,709

(22) Filed: Jan. 26, 2017

(65) Prior Publication Data

US 2017/0222947 A1 Aug. 3, 2017

Related U.S. Application Data

(60) Provisional application No. 62/288,101, filed on Jan. 28, 2016.

(51) Int. Cl.
*H04L 12/26* (2006.01)
*G06F 11/30* (2006.01)
(Continued)

(52) U.S. Cl.
CPC .......... *H04L 43/0876* (2013.01); *G06F 9/451* (2018.02); *G06F 11/3006* (2013.01);
(Continued)

(58) Field of Classification Search
CPC ..... H04L 63/30; H04L 5/0007; H04L 5/0053; H04L 63/304; H04L 65/4076;
(Continued)

(56) References Cited

U.S. PATENT DOCUMENTS 7,010,607 B1 3/2006 Bunton
7,103,626 B1* 9/2006 Recio ................ H04L 29/12207
709/201

(Continued)

OTHER PUBLICATIONS

European Patent Office, International Searching Authority, International Search Report and Written Opinion dated Apr. 11, 2017 for International Application No. PCT/US2017/015484, 15 Pages.

(Continued)

*Primary Examiner* — Natasha W Cosme
(74) *Attorney, Agent, or Firm* — Tucker Ellis LLP

(57) ABSTRACT

System and method providing resource access control within a single partition in a network switch environment in a high performance computing environment. A resource request portion of an IB packet includes data identifying a resource request for a requested resource, and a context identification portion of the packet includes data identifying a context of the resource request. Access rights to a controlled resource are determined based on the requested resource relative to the controlled resource and according to a comparison of the context of the resource request relative to one or more valid request context values. A resource table storing valid Q_Key and P_Key context values may be indexed by a Dest. QP of the packet header to determine selective access to the controlled resource and/or to data relating to the controlled resource.

20 Claims, 14 Drawing Sheets

(51) Int. Cl.
| | |
|---|---|
| *G11C 15/00* | (2006.01) |
| *H04L 12/813* | (2013.01) |
| *H04L 29/08* | (2006.01) |
| *H04L 12/743* | (2013.01) |
| *H04L 12/947* | (2013.01) |
| *H04L 12/931* | (2013.01) |
| *H04L 29/06* | (2006.01) |
| *H04L 12/911* | (2013.01) |
| *G06F 9/45* | (2006.01) |
| *G06F 9/451* | (2018.01) |

(52) U.S. Cl.
CPC .......... *G11C 15/00* (2013.01); *H04L 45/7457* (2013.01); *H04L 47/20* (2013.01); *H04L 47/70* (2013.01); *H04L 49/25* (2013.01); *H04L 49/358* (2013.01); *H04L 67/1097* (2013.01); *H04L 69/22* (2013.01); *G06F 2201/88* (2013.01)

(58) Field of Classification Search
CPC ............... H04L 12/1863; H04L 12/189; H04L 12/2801; H04L 12/2834; H04L 12/5692; H04L 12/66; H04L 1/00; H04L 1/0026; H04L 29/06027; H04L 43/0864; H04L 43/16
USPC .......................................................... 370/329
See application file for complete search history.

(56) References Cited

U.S. PATENT DOCUMENTS

| | | |
|---|---|---|
| 7,171,484 B1 | 1/2007 | Krause et al. |
| 7,983,265 B1 | 7/2011 | Dropps |
| 8,949,389 B1 | 2/2015 | Rimmer |
| 2003/0223435 A1 | 12/2003 | Gil |
| 2004/0022245 A1 | 2/2004 | Forbes et al. |
| 2004/0022257 A1 | 2/2004 | Green et al. |
| 2004/0024903 A1 | 2/2004 | Costatino et al. |
| 2004/0100950 A1 | 5/2004 | Basu et al. |
| 2004/0215848 A1 | 10/2004 | Craddock et al. |
| 2005/0071472 A1 | 3/2005 | Arndt et al. |
| 2005/0144313 A1 | 6/2005 | Arndt et al. |
| 2005/0271073 A1 | 12/2005 | Johnsen et al. |
| 2006/0002385 A1 | 1/2006 | Johnsen et al. |
| 2008/0267183 A1 | 10/2008 | Arndt et al. |
| 2009/0070422 A1 | 3/2009 | Kashyap et al. |
| 2009/0141728 A1 | 6/2009 | Brown et al. |
| 2010/0290464 A1 | 11/2010 | Assarpour |
| 2012/0106354 A1 | 5/2012 | Pleshek et al. |
| 2012/0170582 A1 | 7/2012 | Abts et al. |
| 2012/0195308 A1 | 8/2012 | Shiraki |
| 2012/0307682 A1 | 12/2012 | Johnsen et al. |
| 2013/0054947 A1 | 2/2013 | Gavrilov |
| 2013/0086298 A1 | 4/2013 | Alanis et al. |
| 2013/0266009 A1 | 10/2013 | Colloff et al. |
| 2013/0301645 A1 | 11/2013 | Bogdanski et al. |
| 2014/0016645 A1 | 1/2014 | Nomura et al. |
| 2014/0317165 A1 | 10/2014 | Pelissier et al. |
| 2015/0023214 A1 | 1/2015 | Soneda et al. |
| 2015/0067191 A1 | 3/2015 | Makhervaks et al. |
| 2015/0098466 A1* | 4/2015 | Haramaty ............ H04L 61/103 370/390 |
| 2015/0113132 A1 | 4/2015 | Srinivas et al. |
| 2015/0180782 A1 | 6/2015 | Rimmer et al. |
| 2015/0295758 A1 | 10/2015 | Melander et al. |
| 2016/0072816 A1 | 3/2016 | Makhervaks et al. |
| 2016/0179582 A1 | 6/2016 | Skerry et al. |
| 2016/0274926 A1 | 9/2016 | Narasimhamurthy et al. |
| 2017/0099195 A1 | 4/2017 | Raney |
| 2017/0289016 A1 | 10/2017 | Ficet et al. |
| 2018/0026878 A1 | 1/2018 | Zahavi et al. |

OTHER PUBLICATIONS

Bartosz Bogdanski et al., "Making the Network Scalable: Inter-subnet Routing in InfiniBand", Network and Parallel Computing; LNCS 8097, Aug. 26, 2013, ©Springer-Verlag Berlin Heidelberg 2013, pp. 685-698.
Unknown Author, Disclosed by International Business Machines Corporation, "Local Area Network (LAN) Emulation over InfiniBand", Sep. 18, 2003, 2 pages.
European Patent Office, International Searching Authority, International Search Report and Written Opinion dated Apr. 5, 2017 for International Application No. PCT/US2017/015464, 10 Pages.
Bogdanski, et al., "Making the Network Scalable: Inter-subnet Routing in InfiniBand", Aug. 26, 2013, pp. 685-698, 14 pages.
International Search Report and the Written Opinion of the International Searching Authority dated Apr. 5, 2017 for PCT Application No. PCT/US2017/015464, 10 pages.
International Search Report and the Written Opinion of the International Searching Authority dated Apr. 11, 2017 for PCT Application No. PCT/US2017/015484, 15 pages.
United States Patent and Trademark Office, Office Action dated Mar. 29, 2018 for U.S. Appl. No. 15/416,696, 14 Pages.
United States Patent and Trademark Office, Office Action dated May 31, 2018 for U.S. Appl. No. 15/416,642, 32 Pages.
United States Patent and Trademark Offce, Office Action dated Sep. 6, 2018 for U.S. Appl. No. 15/414,227, 16 Pages.
United States Patent and Trademark Office, Office Action dated Sep. 18, 2018 for U.S. Appl. No. 15/414,211, 63 Pages.
United States Patent and Trademark Office, Notice of Allowance dated Sep. 27, 2018 for U.S. Appl. No. 15/416,696, 17 Pages.
United States Patent and Trademark Office, Office Action dated Oct. 3, 2018 for U.S. Appl. No. 15/656,856, 20 Pages.
United States Patent and Trademark Office, Office Action dated Oct. 3, 2018 for U.S. Appl. No. 15/656,857, 20 Pages.
United States Patent and Trademark Office, Office Action dated Oct. 4, 2018 for U.S. Appl. No. 15/656,977, 24 Pages.
United States Patent and Trademark Office, Office Action dated Oct. 5, 2018 for U.S. Appl. No. 15/656,981, 31 Pages.

* cited by examiner

SYSTEM AND METHOD FOR USING Q_KEY VALUE ENFORCEMENT AS A FLEXIBLE WAY OF PROVIDING RESOURCE ACCESS CONTROL WITHIN A SINGLE PARTITION IN A HIGH PERFORMANCE COMPUTING ENVIRONMENT

CLAIM OF PRIORITY AND CROSS REFERENCE TO RELATED APPLICATIONS

This application claims the benefit of priority to U.S. Provisional Patent Application entitled "SYSTEM AND METHOD FOR USING SUBNET PREFIX VALUES IN GLOBAL ROUTE HEADERS FOR LINEAR FORWARDING TABLE LOOKUP IN A HIGH PERFORMANCE COMPUTING ENVIRONMENT", Application No. 62/288,101, filed on Jan. 28, 2016, which is incorporated by reference in its entirety.

This application is related to the following patent applications, each of which is hereby incorporated by reference in its entirety:

U.S. patent application entitled "SYSTEM AND METHOD FOR USING SUBNET PREFIX VALUES IN GLOBAL ROUTE HEADER (GRH) FOR LINEAR FORWARDING TABLE (LFT) LOOKUP IN A HIGH PERFORMANCE COMPUTING ENVIRONMENT", application Ser. No. 15/416,642, filed Jan. 26, 2017; and U.S. patent application entitled "SYSTEM AND METHOD FOR ALLOWING MULTIPLE GLOBAL IDENTIFIER (GID) SUBNET PREFIX VALUES CONCURRENTLY FOR INCOMING PACKET PROCESSING IN A HIGH PERFORMANCE COMPUTING ENVIRONMENT", application Ser. No. 15/146,696, filed Jan. 26, 2017.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD

The embodiments herein are generally related to computer systems, and are particularly related to providing network switch functionality for Q_Key based control of access to resources in a network environment.

BACKGROUND

As larger cloud computing architectures are introduced, the performance and administrative bottlenecks associated with the traditional network and storage have become a significant problem. There has been an increased interest in using high performance lossless interconnects such as InfiniBand (IB) technology as the foundation for a cloud computing fabric.

Shared services within an InfiniBand™ (IB) fabric can be protected by controlling partition membership for both IB ports representing clients of the shared service as well as IB ports representing providers of the shared service.

When a single IB port represents a single resource that each relevant client may access, then it is possible to use a partition membership scheme. In this partition membership scheme, the clients may be limited members of the relevant partition and the provider may be a full member of the relevant partition. In this way, all clients can access the shared resource but they will not be able to communicate between themselves using the relevant partition.

However, when a provider represents a large number of individual resources that each should only be available to a single client or a limited set of clients, as well as when groups of clients require full membership in a partition that is used to access shared resources, then the provider of the shared service will either need to have membership in a large number of partitions and/or it will need to differentiate client access rights using more information that just the partition information in incoming request packets.

One proposed solution would be to use the source GID/GUID and/or the source LID of the request packets in order to identify the sender. However, this has the disadvantage that one then has to use different context describing each individual client port and this can be a scalability issue if multiple clients share the same resource, and in addition, the use of GID/GUIDs requires complex hash (or CAM in HW) based lookup schemes rather than simple linearly addressed lookup tables in order to facilitate access control operations to take place at wire speed of the incoming request packets.

Another issue with both LID and GID/GUID based access control is that such values can change due to subnet/fabric re-configuration as well as due to migration of clients between different HCAs.

This is the general area that embodiments of the claimed invention are intended to address.

SUMMARY

Described herein are systems and methods that can support flexible resource access control within a single partition of a network.

The value of a portion of an IB packet header is used to identify access rights to a resource and the resource itself can be identified by other portions of the IB packet header. In one form, a Q_Key value of the IB packet header is used to identify the access rights to the resource. The resource may be identified by the destination QP number portion of the IB packet header or via a combination of one or more bit fields from the destination QP number as well as one or more bit fields from the Q_Key value of the IB packet header.

A resource table is provided mapping one or more supported Dest. QP values with a corresponding one or more supported Q_Key and P_Key pairs. A requested Dest. QP of the IB header is used to indexing the resource table to locate a first supported Q_Key and P_Key pair. Access to the controlled resource is allowed responsive to determining a correspondence between the Q_Key of the first packet and the first supported Q_Key of the located first supported Q_Key and P_Key pair and determining a correspondence between the P_Key of the first packet and the first supported P_Key of the located first supported Q_Key and P_Key pair. Access to the controlled resource is denied responsive to determining a non-correspondence between the Q_Key of the first packet and the first supported Q_Key of the located first supported Q_Key and P_Key pair or determining a correspondence between the P_Key of the first packet and the first supported P_Key of the located first supported Q_Key and P_Key pair.

The exemplary systems and methods may be applied in high performance computing environments that use intra- and inter-subnet address resolution, such as engineered systems for middleware and application execution or a middleware machine environment, using subnet prefix values in global route headers (GRHs) for linear forwarding table (LFT) lookup in a high performance computing environments. The exemplary systems and methods may be applied in other high performance computing environments as well.

DETAILED DESCRIPTION

Figure 1:
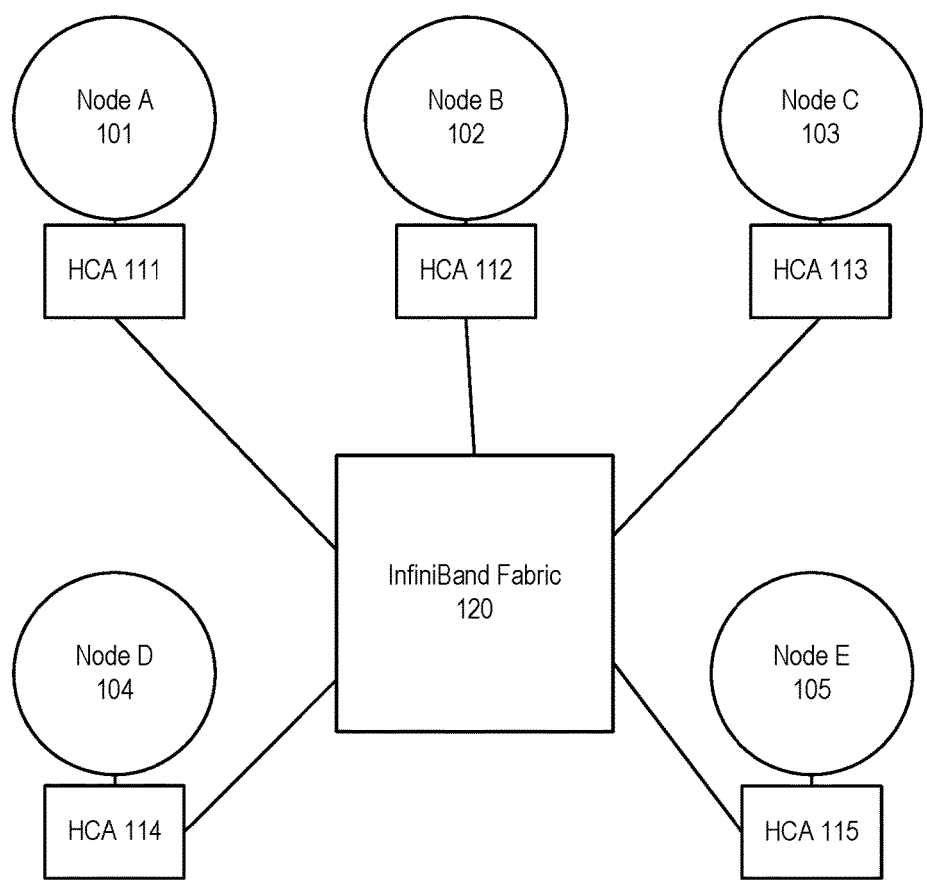
FIG. 1 shows an illustration of an InfiniBand environment, in accordance with an embodiment.

The example embodiments are illustrated, by way of example and not by way of limitation, in the figures of the accompanying drawings in which like references indicate similar elements. It should be noted that references to "an" or "one" or "some" embodiment(s) in this disclosure are not necessarily to the same embodiment, and such references mean at least one. While specific implementations are discussed, it is understood that the specific implementations are provided for illustrative purposes only. A person skilled in the relevant art will recognize that other components and configurations may be used without departing from the scope and spirit of the claimed invention.

Common reference numerals can be used to indicate like elements throughout the drawings and detailed description; therefore, reference numerals used in a figure may or may not be referenced in the detailed description specific to such figure if the element is described elsewhere.

Described herein are systems and methods that support multiple global identifier (GID) subnet prefix values concurrently. It is to be appreciated that allowing multiple GID subnet prefix values concurrently beneficially enables, among other things, intra- and inter-subnet forwarding decisions enabling live migration of virtual machines (VMs) using subnet prefix values in global route headers (GRHs) for linear forwarding table (LFT) lookup in a high performance computing environments.

The following description of the example embodiments uses an InfiniBand™ (IB) network as an example for a high performance network. Throughout the following description, reference can be made to the InfiniBand™ specification (also referred to variously as the InfiniBand specification, IB specification, or the legacy IB specification). Such reference is understood to refer to the InfiniBand® Trade Association Architecture Specification, Volume 1, Version 1.3, released March, 2015, available at http://www.inifinibandta.org, which is herein incorporated by reference in its entirety. It will be apparent to those skilled in the art that other types of high performance networks can be used without limitation. The following description also uses the fat-tree topology as an example for a fabric topology. It will be apparent to those skilled in the art that other types of fabric topologies can be used without limitation.

To meet the demands of the cloud in the current era (e.g., Exascale era), it is desirable for virtual machines to be able to utilize low overhead network communication paradigms such as Remote Direct Memory Access (RDMA). RDMA bypasses the OS stack and communicates directly with the hardware, thus, pass-through technology like Single-Root I/O Virtualization (SR-IOV) network adapters can be used. In accordance with an embodiment, a virtual switch (vSwitch) SR-IOV architecture can be provided for applicability in high performance lossless interconnection networks. As network reconfiguration time is critical to make live-migration a practical option, in addition to network architecture, a scalable and topology-agnostic dynamic reconfiguration mechanism can be provided.

In accordance with an embodiment, and furthermore, routing strategies for virtualized environments using vSwitches can be provided, and an efficient routing algorithm for network topologies (e.g., Fat-Tree topologies) can be provided. The dynamic reconfiguration mechanism can be further tuned to minimize imposed overhead in Fat-Trees.

In accordance with an embodiment, virtualization can be beneficial to efficient resource utilization and elastic resource allocation in cloud computing. Live migration makes it possible to optimize resource usage by moving virtual machines (VMs) between physical servers in an application transparent manner. Thus, virtualization can enable consolidation, on-demand provisioning of resources, and elasticity through live migration.

InfiniBand™

InfiniBand™ (IB) is an open standard lossless network technology developed by the InfiniBand™ Trade Association. The technology is based on a serial point-to-point full-duplex interconnect that offers high throughput and low latency communication, geared particularly towards high-performance computing (HPC) applications and datacenters.

The InfiniBand™ Architecture (IBA) supports a two-layer topological division. At the lower layer, IB networks are referred to as subnets, where a subnet can include a set of hosts interconnected using switches and point-to-point links.

At the higher level, an IB fabric constitutes one or more subnets, which can be interconnected using routers.

Within a subnet, hosts can be connected using switches and point-to-point links. Additionally, there can be a master management entity, the subnet manager (SM), which resides on a designated device in the subnet. The subnet manager is responsible for configuring, activating and maintaining the IB subnet. Additionally, the subnet manager (SM) can be responsible for performing routing table calculations in an IB fabric. Here, for example, the routing of the IB network aims at proper load balancing between all source and destination pairs in the local subnet.

Through the subnet management interface, the subnet manager exchanges control packets, which are referred to as subnet management packets (SMPs), with subnet management agents (SMAs). The subnet management agents reside on every IB subnet device. By using SMPs, the subnet manager is able to discover the fabric, configure end nodes and switches, and receive notifications from SMAs.

In accordance with an embodiment, intra-subnet routing in an IB network can be based on linear forwarding tables (LFTs) stored in the switches. The LFTs are calculated by the SM according to the routing mechanism in use. In a subnet, Host Channel Adapter (HCA) ports on the end nodes and switches are addressed using local identifiers (LIDs). Each entry in a linear forwarding table (LFT) consists of a destination LID (DLID) and an output port. Only one entry per LID in the table is supported. When a packet arrives at a switch, its output port is determined by looking up the DLID in the forwarding table of the switch. The routing is deterministic as packets take the same path in the network between a given source-destination pair (LID pair).

Generally, all other subnet managers, excepting the master subnet manager, act in standby mode for fault-tolerance. In a situation where a master subnet manager fails, however, a new master subnet manager is negotiated by the standby subnet managers. The master subnet manager also performs periodic sweeps of the subnet to detect any topology changes and reconfigures the network accordingly.

Furthermore, hosts and switches within a subnet can be addressed using local identifiers (LIDs), and a single subnet can be limited to 49151 unicast LIDs. Besides the LIDs, which are the local addresses that are valid within a subnet, each IB device can have a 64-bit global unique identifier (GUID). A GUID can be used to form a global identifier (GID), which is an IB layer three (L3) address.

The SM can calculate routing tables (i.e., the connections/routes between each pair of nodes within the subnet) at network initialization time. Furthermore, the routing tables can be updated whenever the topology changes, in order to ensure connectivity and optimal performance. During normal operations, the SM can perform periodic light sweeps of the network to check for topology changes. If a change is discovered during a light sweep or if a message (trap) signaling a network change is received by the SM, the SM can reconfigure the network according to the discovered changes.

For example, the SM can reconfigure the network when the network topology changes, such as when a link goes down, when a device is added, or when a link is removed. The reconfiguration steps can include the steps performed during the network initialization. Furthermore, the reconfigurations can have a local scope that is limited to the subnets, in which the network changes occurred. Also, the segmenting of a large fabric with routers may limit the reconfiguration scope.

An example InfiniBand fabric is shown in FIG. 1, which shows an illustration of an InfiniBand environment 100, in accordance with an embodiment. In the example shown in FIG. 1, nodes A-E, 101-105, use the InfiniBand fabric, 120, to communicate, via the respective host channel adapters 111-115. In accordance with an embodiment, the various nodes, e.g., nodes A-E, 101-105, can be represented by various physical devices. In accordance with an embodiment, the various nodes, e.g., nodes A-E, 101-105, can also be represented by various virtual devices, such as virtual machines.

Partitioning in InfiniBand

In accordance with an embodiment, IB networks can support partitioning as a security mechanism to provide for isolation of logical groups of systems sharing a network fabric. Each HCA port on a node in the fabric can be a member of one or more partitions. Partition memberships are managed by a centralized partition manager, which can be part of the SM. The SM can configure partition membership information on each port as a table of 16-bit partition keys (P_Keys). The SM can also configure switch and router ports with the partition enforcement tables containing P_Key information associated with the end-nodes that send or receive data traffic through these ports. Additionally, in a general case, partition membership of a switch port can represent a union of all membership indirectly associated with LIDs routed via the port in an egress (towards the link) direction.

In accordance with an embodiment, partitions are logical groups of ports such that the members of a group can only communicate to other members of the same logical group. At host channel adapters (HCAs) and switches, packets can be filtered using the partition membership information to enforce isolation. Packets with invalid partitioning information can be dropped as soon as the packets reaches an incoming port. In partitioned IB systems, partitions can be used to create tenant clusters. With partition enforcement in place, a node cannot communicate with other nodes that belong to a different tenant cluster. In this way, the security of the system can be guaranteed even in the presence of compromised or malicious tenant nodes.

In accordance with an embodiment, for the communication between nodes, Queue Pairs (QPs) and End-to-End contexts (EECs) can be assigned to a particular partition, except for the management Queue Pairs (QP0 and QP1). The P_Key information can then be added to every IB transport packet sent. When a packet arrives at an HCA port or a switch, its P_Key value can be validated against a table configured by the SM. If an invalid P_Key value is found, the packet is discarded immediately. In this way, communication is allowed only between ports sharing a partition.

Figure 2:
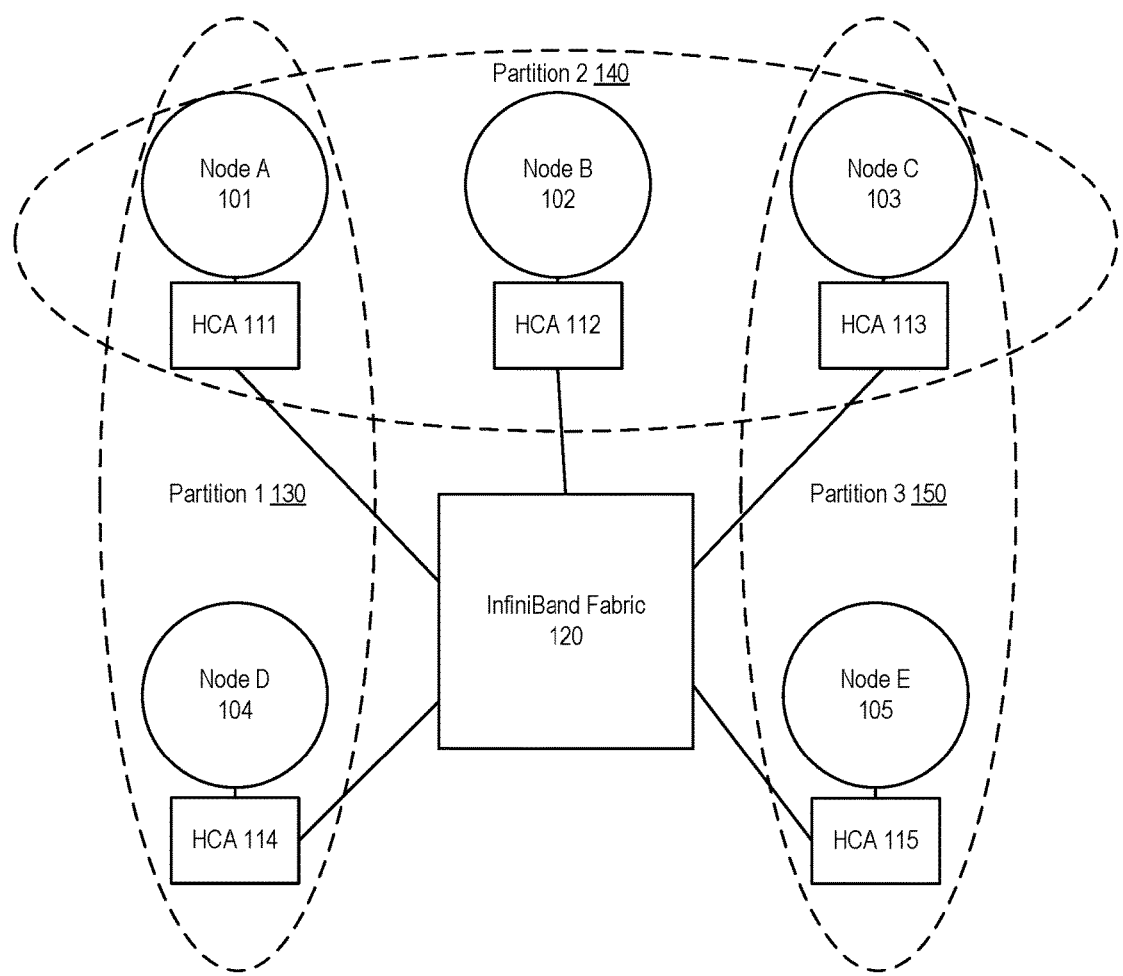
FIG. 2 shows an illustration of a partitioned cluster environment, in accordance with an embodiment

An example of IB partitions is shown in FIG. 2, which shows an illustration of a partitioned cluster environment, in accordance with an embodiment. In the example shown in FIG. 2, nodes A-E, 101-105, use the InfiniBand fabric, 120, to communicate, via the respective host channel adapters 111-115. The nodes A-E are arranged into partitions, namely partition 1, 130, partition 2, 140, and partition 3, 150. Partition 1 comprises node A 101 and node D 104. Partition 2 comprises node A 101, node B 102, and node C 103. Partition 3 comprises node C 103 and node E 105. Because of the arrangement of the partitions, node D 104 and node E 105 are not allowed to communicate as these nodes do not share a partition. Meanwhile, for example, node A 101 and node C 103 are allowed to communicate as these nodes are both members of partition 2, 140.

Virtual Machines in InfiniBand

During the last decade, the prospect of virtualized High Performance Computing (HPC) environments has improved considerably as CPU overhead has been practically removed through hardware virtualization support; memory overhead has been significantly reduced by virtualizing the Memory Management Unit; storage overhead has been reduced by the use of fast SAN storages or distributed networked file systems; and network I/O overhead has been reduced by the use of device passthrough techniques like Single Root Input/Output Virtualization (SR-IOV). It is now possible for clouds to accommodate virtual HPC (vHPC) clusters using high performance interconnect solutions and deliver the necessary performance.

However, when coupled with lossless networks, such as InfiniBand (IB), certain cloud functionality, such as live migration of virtual machines (VMs), still remains an issue due to the complicated addressing and routing schemes used in these solutions. IB is an interconnection network technology offering high bandwidth and low latency, thus, is very well suited for HPC and other communication intensive workloads.

The traditional approach for connecting IB devices to VMs is by utilizing SR-IOV with direct assignment. However, achieving live migration of VMs assigned with IB Host Channel Adapters (HCAs) using SR-IOV has proved to be challenging. Each IB connected node has three different addresses: LID, GUID, and GID. When a live migration happens, one or more of these addresses change. Other nodes communicating with the VM-in-migration can lose connectivity. When this happens, the lost connection can be attempted to be renewed by locating the virtual machine's new address to reconnect to by sending Subnet Administration (SA) path record queries to the IB Subnet Manager (SM).

Layers and Addressing in InfiniBand

The IB architecture is divided into multiple layers wherein each of the multiple layers operates separately and independently from the other layers. On one end of IB Layer abstraction, the IB Physical Layer defines the electrical and mechanical characteristics of the IB system, and on the other end of IB Layer abstraction the IB Upper Layer communicates transactions between host and remote clients. The IB Transport Layer operates to provide partitioning, channel multiplexing, transport services, and packet segmentation and reassembly when sending and receiving data, respectively. Packet forwarding and switching within a subnet is handled at the IB Link Layer, and the IB Network Layer handles routing of the packets from one subnet to another.

In general, the Network Layer defines the protocol for routing a packet within a single subnet and between different subnets. For this the IB architecture uses three different types of addresses. A first type of IB address is the 16 bits Local Identifier (LID). At least one unique LID is assigned to each HCA port and each switch by the SM. The LIDs are used to route traffic within a subnet wherein Link Level switching forwards packets from a device specified by a source LID (SLID) within a Local Route Header (LRH) of the packet to a device specified by a destination LID (DLID) within the Local Route Header LRH. Since the LID is 16 bits long, 65536 unique address combinations can be made, of which only 49151 (0x0001-0xBFFF) can be used as unicast addresses. Consequently, the number of available unicast addresses defines the maximum size of an IB subnet.

A second type of IB address is the 64 bits Global Unique Identifier (GUID) assigned by the manufacturer to each device (e.g. HCAs and switches) and each HCA port. The SM may assign additional subnet unique GUIDs to an HCA port, which is useful when SR-IOV is used. Routers operating at the Network Layer send packets containing a Global Route Header (GRH) between different subnets. The routers forward the packets across subnets using the unique GUID of each device. In the process, the last router in the packet path towards the destination port in the destination subnet modifies the LRH of the packets by replacing the source LID in the LRH with the proper LID of the destination port.

A third type of address is the 128 bits Global Identifier (GID). The GID is a valid IPv6 unicast address, and at least one is assigned to each HCA port. The GID is formed by combining a globally unique 64 bits prefix assigned by the fabric administrator, and the GUID address of each HCA port. GIDs are independent of LIDs and, as such, remain unaffected by subnet reconfiguration.

Fat-Tree (FTree) Topologies and Routing

In accordance with an embodiment, some of the IB based HPC systems employ a fat-tree topology to take advantage of the useful properties fat-trees offer. These properties include full bisection-bandwidth and inherent fault-tolerance due to the availability of multiple paths between each source destination pair. The initial idea behind fat-trees was to employ fatter links between nodes, with more available bandwidth, as the tree moves towards the roots of the topology. The fatter links can help to avoid congestion in the upper-level switches and the bisection-bandwidth is maintained.

Figure 3:
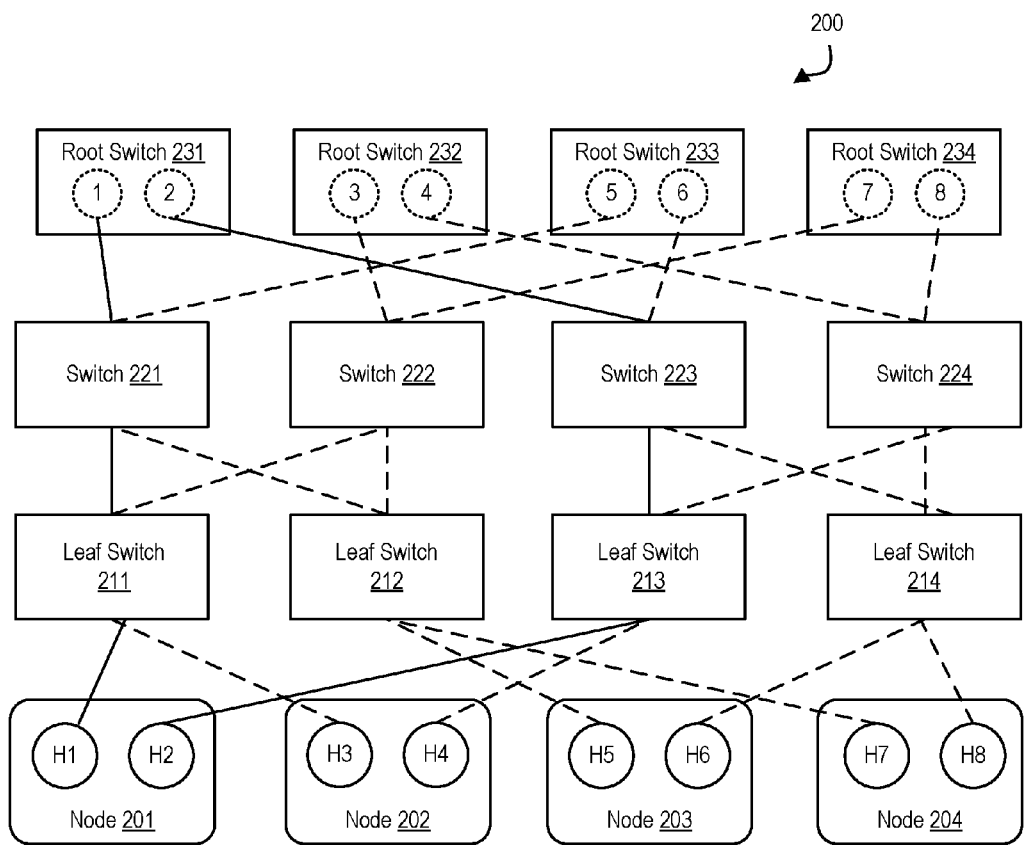
FIG. 3 shows an illustration of a tree topology in a network environment, in accordance with an embodiment.

FIG. 3 shows an illustration of a tree topology in a network environment, in accordance with an embodiment. As shown in FIG. 3, one or more end nodes 201-204 can be connected in a network fabric 200. The network fabric 200 can be based on a fat-tree topology, which includes a plurality of leaf switches 211-214, and multiple spine switches or root switches 231-234. Additionally, the network fabric 200 can include one or more intermediate switches, such as switches 221-224.

Also as shown in FIG. 3, each of the end nodes 201-204 can be a multi-homed node, i.e., a single node that is connected to two or more parts of the network fabric 200 through multiple ports. For example, the node 201 can include the ports H1 and H2, the node 202 can include the ports H3 and H4, the node 203 can include the ports H5 and H6, and the node 204 can include the ports H7 and H8.

Additionally, each switch can have multiple switch ports. For example, the root switch 231 can have the switch ports 1-2, the root switch 232 can have the switch ports 3-4, the root switch 233 can have the switch ports 5-6, and the root switch 234 can have the switch ports 7-8.

In accordance with an embodiment, the fat-tree routing mechanism is one of the most popular routing algorithm for IB based fat-tree topologies. The fat-tree routing mechanism is also implemented in the OFED (Open Fabric Enterprise Distribution—a standard software stack for building and deploying IB based applications) subnet manager, OpenSM.

The fat-tree routing mechanism aims to generate LFTs that evenly spread shortest-path routes across the links in the network fabric. The mechanism traverses the fabric in the indexing order and assigns target LIDs of the end nodes, and thus the corresponding routes, to each switch port. For the end nodes connected to the same leaf switch, the indexing order can depend on the switch port to which the end node is connected (i.e., port numbering sequence). For each port, the mechanism can maintain a port usage counter, and can use this port usage counter to select a least-used port each time a new route is added.

In accordance with an embodiment, in a partitioned subnet, nodes that are not members of a common partition are not allowed to communicate. Practically, this means that some of the routes assigned by the fat-tree routing algorithm are not used for the user traffic. The problem arises when the fat tree routing mechanism generates LFTs for those routes the same way it does for the other functional paths. This behavior can result in degraded balancing on the links, as nodes are routed in the order of indexing. As routing can be performed oblivious to the partitions, fat-tree routed subnets, in general, provide poor isolation among partitions.

In accordance with an embodiment, a Fat-Tree is a hierarchical network topology that can scale with the available network resources. Moreover, Fat-Trees are easy to build using commodity switches placed on different levels of the hierarchy. Different variations of Fat-Trees are commonly available, including k-ary-n-trees, Extended Generalized Fat-Trees (XGFTs), Parallel Ports Generalized Fat-Trees (PGFTs) and Real Life Fat-Trees (RLFTs).

A k-ary-n-tree is an n level Fat-Tree with $k^n$ end nodes and $n \cdot k^{n-1}$ switches, each with 2 k ports. Each switch has an equal number of up and down connections in the tree. XGFT Fat-Tree extends k-ary-n-trees by allowing both different number of up and down connections for the switches, and different number of connections at each level in the tree. The PGFT definition further broadens the XGFT topologies and permits multiple connections between switches. A large variety of topologies can be defined using XGFTs and PGFTs. However, for practical purposes, RLFT, which is a restricted version of PGFT, is introduced to define Fat-Trees commonly found in today's HPC clusters. An RLFT uses the same port-count switches at all levels in the Fat-Tree.

Input/Output (I/O) Virtualization

In accordance with an embodiment, I/O Virtualization (IOV) can provide availability of I/O by allowing virtual machines (VMs) to access the underlying physical resources. The combination of storage traffic and inter-server communication impose an increased load that may overwhelm the I/O resources of a single server, leading to backlogs and idle processors as they are waiting for data. With the increase in number of I/O requests, IOV can provide availability; and can improve performance, scalability and flexibility of the (virtualized) I/O resources to match the level of performance seen in modern CPU virtualization.

In accordance with an embodiment, IOV is desired as it can allow sharing of I/O resources and provide protected access to the resources from the VMs. IOV decouples a logical device, which is exposed to a VM, from its physical implementation. Currently, there can be different types of IOV technologies, such as emulation, paravirtualization, direct assignment (DA), and single root-I/O virtualization (SR-IOV).

In accordance with an embodiment, one type of IOV technology is software emulation. Software emulation can allow for a decoupled front-end/back-end software architecture. The front-end can be a device driver placed in the VM, communicating with the back-end implemented by a hypervisor to provide I/O access. The physical device sharing ratio is high and live migrations of VMs are possible with just a few milliseconds of network downtime. However, software emulation introduces additional, undesired computational overhead.

In accordance with an embodiment, another type of IOV technology is direct device assignment. Direct device assignment involves a coupling of I/O devices to VMs, with no device sharing between VMs. Direct assignment, or device passthrough, provides near to native performance with minimum overhead. The physical device bypasses the hypervisor and is directly attached to the VM. However, a downside of such direct device assignment is limited scalability, as there is no sharing among virtual machines—one physical network card is coupled with one VM.

In accordance with an embodiment, Single Root IOV (SR-IOV) can allow a physical device to appear through hardware virtualization as multiple independent lightweight instances of the same device. These instances can be assigned to VMs as passthrough devices, and accessed as Virtual Functions (VFs). The hypervisor accesses the device through a unique (per device), fully featured Physical Function (PF). SR-IOV eases the scalability issue of pure direct assignment. However, a problem presented by SR-IOV is that it can impair VM migration. Among these IOV technologies, SR-IOV can extend the PCI Express (PCIe) specification with the means to allow direct access to a single physical device from multiple VMs while maintaining near to native performance. Thus, SR-IOV can provide good performance and scalability.

SR-IOV allows a PCIe device to expose multiple virtual devices that can be shared between multiple guests by allocating one virtual device to each guest. Each SR-IOV device has at least one physical function (PF) and one or more associated virtual functions (VF). A PF is a normal PCIe function controlled by the virtual machine monitor (VMM), or hypervisor, whereas a VF is a light-weight PCIe function. Each VF has its own base address (BAR) and is assigned with a unique requester ID that enables I/O memory management unit (IOMMU) to differentiate between the traffic streams to/from different VFs. The IOMMU also apply memory and interrupt translations between the PF and the VFs.

Unfortunately, however, direct device assignment techniques pose a barrier for cloud providers in situations where transparent live migration of virtual machines is desired for data center optimization. The essence of live migration is that the memory contents of a VM are copied to a remote hypervisor. Then the VM is paused at the source hypervisor, and the VM's operation is resumed at the destination. When using software emulation methods, the network interfaces are virtual so their internal states are stored into the memory and get copied as well. Thus the downtime could be brought down to a few milliseconds.

However, migration becomes more difficult when direct device assignment techniques, such as SR-IOV, are used. In such situations, a complete internal state of the network interface cannot be copied as it is tied to the hardware. The SR-IOV VFs assigned to a VM are instead detached, the live migration will run, and a new VF will be attached at the destination. In the case of InfiniBand and SR-IOV, this process can introduce downtime in the order of seconds. Moreover, in an SR-IOV shared port model the addresses of the VM will change after the migration, causing additional overhead in the SM and a negative impact on the performance of the underlying network fabric.

InfiniBand SR-IOV Architecture—Shared Port

There can be different types of SR-IOV models, e.g. a shared port model, a virtual switch model, and a virtual port model.

Figure 4:
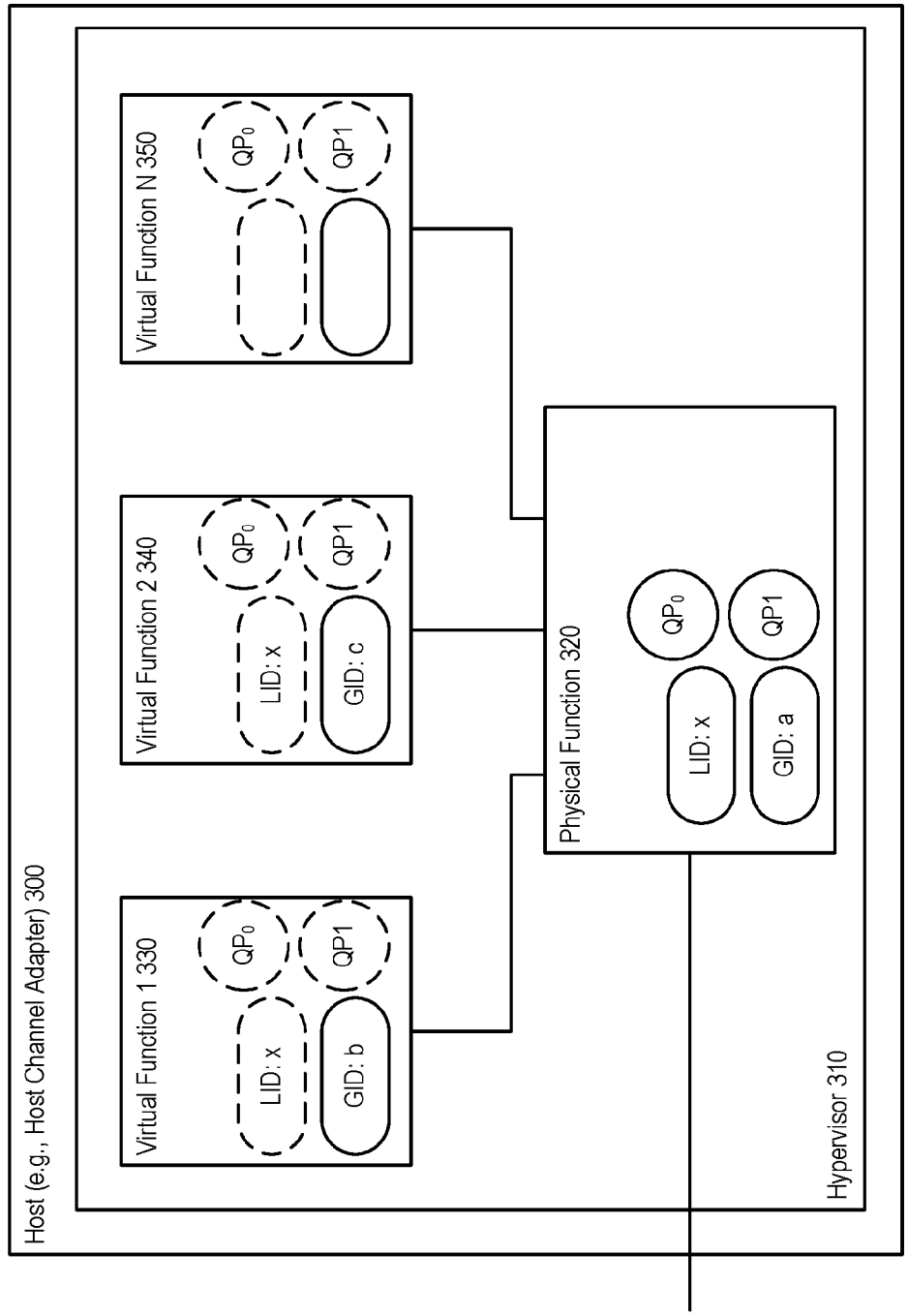
FIG. 4 shows an exemplary shared port architecture, in accordance with an embodiment.

FIG. 4 shows an exemplary shared port architecture, in accordance with an embodiment. As depicted in the figure, a host 300 (e.g., a host channel adapter) can interact with a hypervisor 310, which can assign the various virtual functions 330, 340, 350, to a number of virtual machines. As well, the physical function can be handled by the hypervisor 310.

In accordance with an embodiment, when using a shared port architecture, such as that depicted in FIG. 4, the host, e.g., HCA, appears as a single port in the network with a single shared LID and shared Queue Pair (QP) space between the physical function 320 and the virtual functions 330, 350, 350. However, each function (i.e., physical function and virtual functions) can have their own GID.

As shown in FIG. 4, in accordance with an embodiment, different GIDs can be assigned to the virtual functions and the physical function, and the special queue pairs, QP0 and QP1 (i.e., special purpose queue pairs that are used for InfiniBand management packets), are owned by the physical function. These QPs are exposed to the VFs as well, but the VFs are not allowed to use QP0 (all SMPs coming from VFs towards QP0 are discarded), and QP1 can act as a proxy of the actual QP1 owned by the PF.

In accordance with an embodiment, the shared port architecture can allow for highly scalable data centers that are not limited by the number of VMs (which attach to the network by being assigned to the virtual functions), as the LID space is only consumed by physical machines and switches in the network.

However, a shortcoming of the shared port architecture is the inability to provide transparent live migration, hindering the potential for flexible VM placement. As each LID is associated with a specific hypervisor, and shared among all VMs residing on the hypervisor, a migrating VM (i.e., a virtual machine migrating to a destination hypervisor) has to have its LID changed to the LID of the destination hypervisor. Furthermore, as a consequence of the restricted QP0 access, a subnet manager cannot run inside a VM.

InfiniBand SR-IOV Architecture Models—Virtual Switch (vSwitch)

Figure 5:
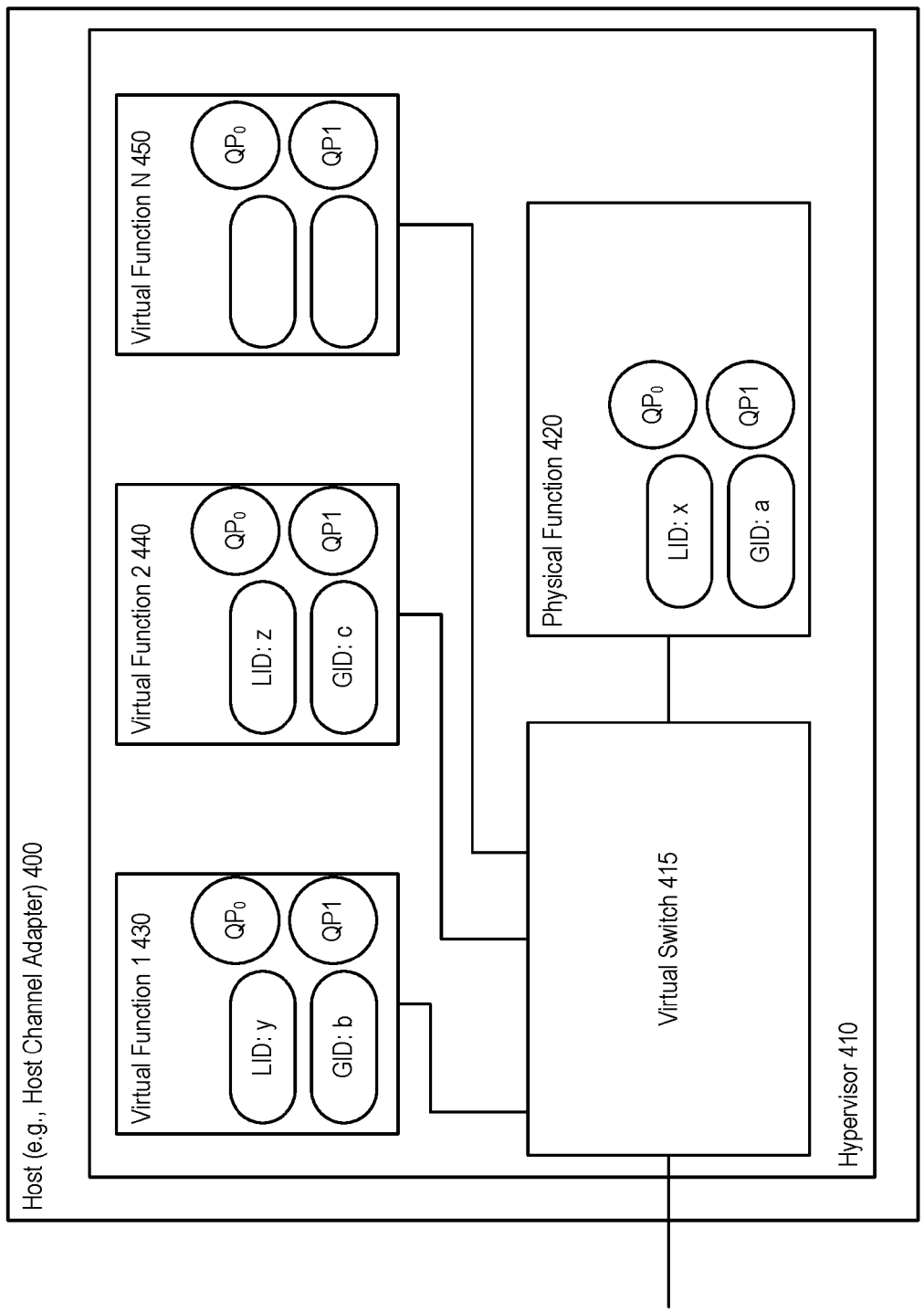
FIG. 5 shows an exemplary vSwitch architecture, in accordance with an embodiment.

FIG. 5 shows an exemplary vSwitch architecture, in accordance with an embodiment. As depicted in the figure, a host 400 (e.g., a host channel adapter) can interact with a hypervisor 410, which can assign the various virtual functions 430, 440, 450, to a number of virtual machines. As well, the physical function can be handled by the hypervisor 410. A virtual switch 415 can also be handled by the hypervisor 401.

In accordance with an embodiment, in a vSwitch architecture each virtual function 430, 440, 450 is a complete virtual Host Channel Adapter (vHCA), meaning that the VM assigned to a VF is assigned a complete set of IB addresses (e.g., GID, GUID, LID) and a dedicated QP space in the hardware. For the rest of the network and the SM, the HCA 400 looks like a switch, via the virtual switch 415, with additional nodes connected to it. The hypervisor 410 can use the PF 420, and the VMs (attached to the virtual functions) can use the VFs.

In accordance with an embodiment, a vSwitch architecture provides transparent virtualization. However, because each virtual function is assigned a unique LID, the number of available LIDs gets consumed rapidly. As well, with many LID addresses in use (i.e., one each for each physical function and each virtual function), more communication paths have to be computed by the SM and more Subnet Management Packets (SMPs) have to be sent to the switches in order to update their LFTs. For example, the computation of the communication paths might take several minutes in large networks. Because LID space is limited to 49151 unicast LIDs, and as each VM (via a VF), physical node, and switch occupies one LID each, the number of physical nodes and switches in the network limits the number of active VMs, and vice versa.

InfiniBand SR-IOV Architecture Models—Virtual Port (vPort)

Figure 6:
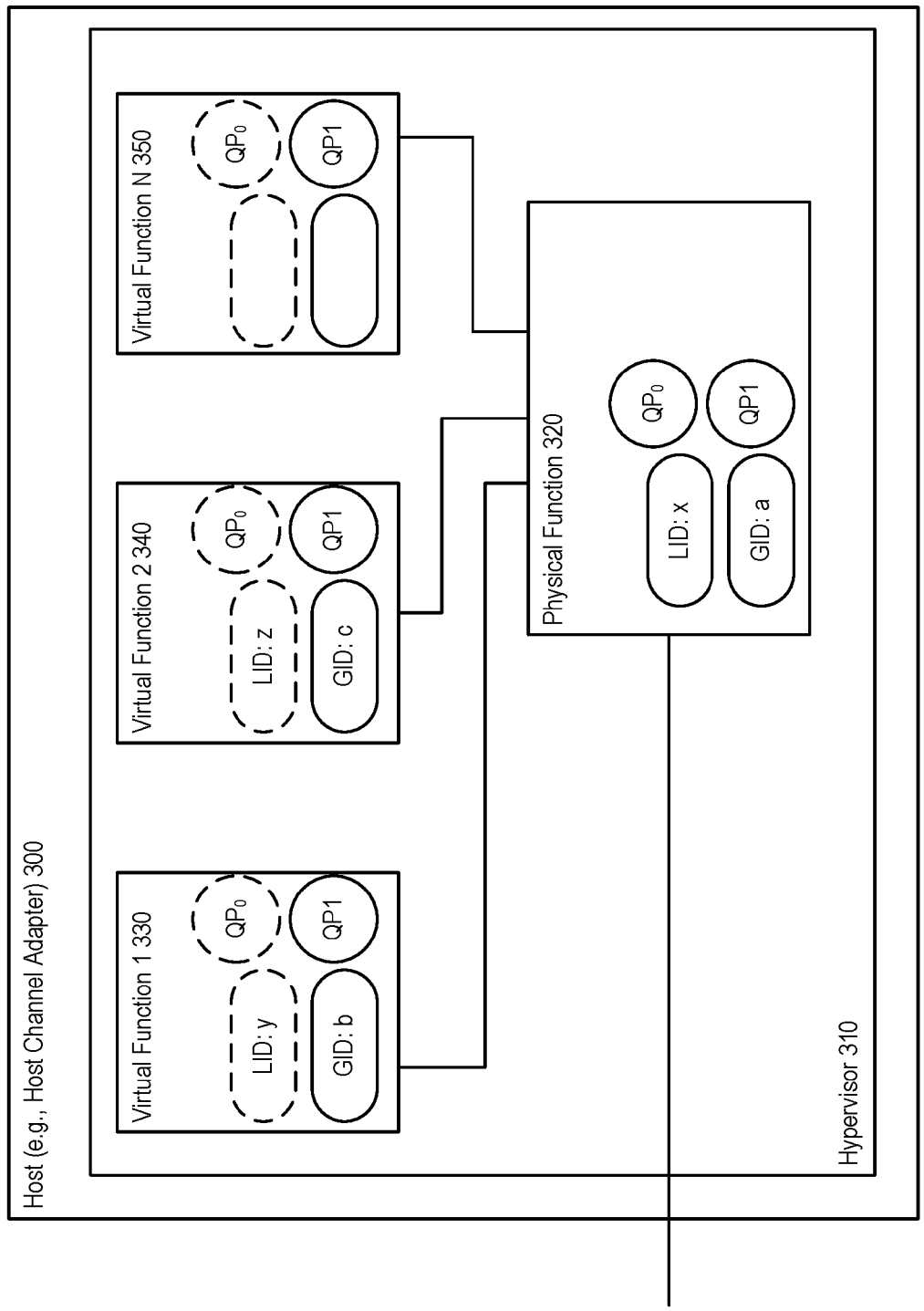
FIG. 6 shows an exemplary vPort architecture, in accordance with an embodiment.

FIG. 6 shows an exemplary vPort concept, in accordance with an embodiment. As depicted in the figure, a host 300 (e.g., a host channel adapter) can interact with a hypervisor 410, which can assign the various virtual functions 330, 340, 350, to a number of virtual machines. As well, the physical function can be handled by the hypervisor 310.

In accordance with an embodiment, the vPort concept is loosely defined in order to give freedom of implementation to vendors (e.g. the definition does not rule that the implementation has to be SRIOV specific), and a goal of the vPort is to standardize the way VMs are handled in subnets. With the vPort concept, both SR-IOV Shared-Port-like and vSwitch-like architectures or a combination of both, that can be more scalable in both the space and performance domains, can be defined. A vPort supports optional LIDs, and unlike the Shared-Port, the SM is aware of all the vPorts available in a subnet even if a vPort is not using a dedicated LID.

InfiniBand SR-IOV Architecture Models—vSwitch with Prepopulated LIDs

In accordance with an embodiment, the present disclosure provides a system and method for providing a vSwitch architecture with prepopulated LIDs.

Figure 7:
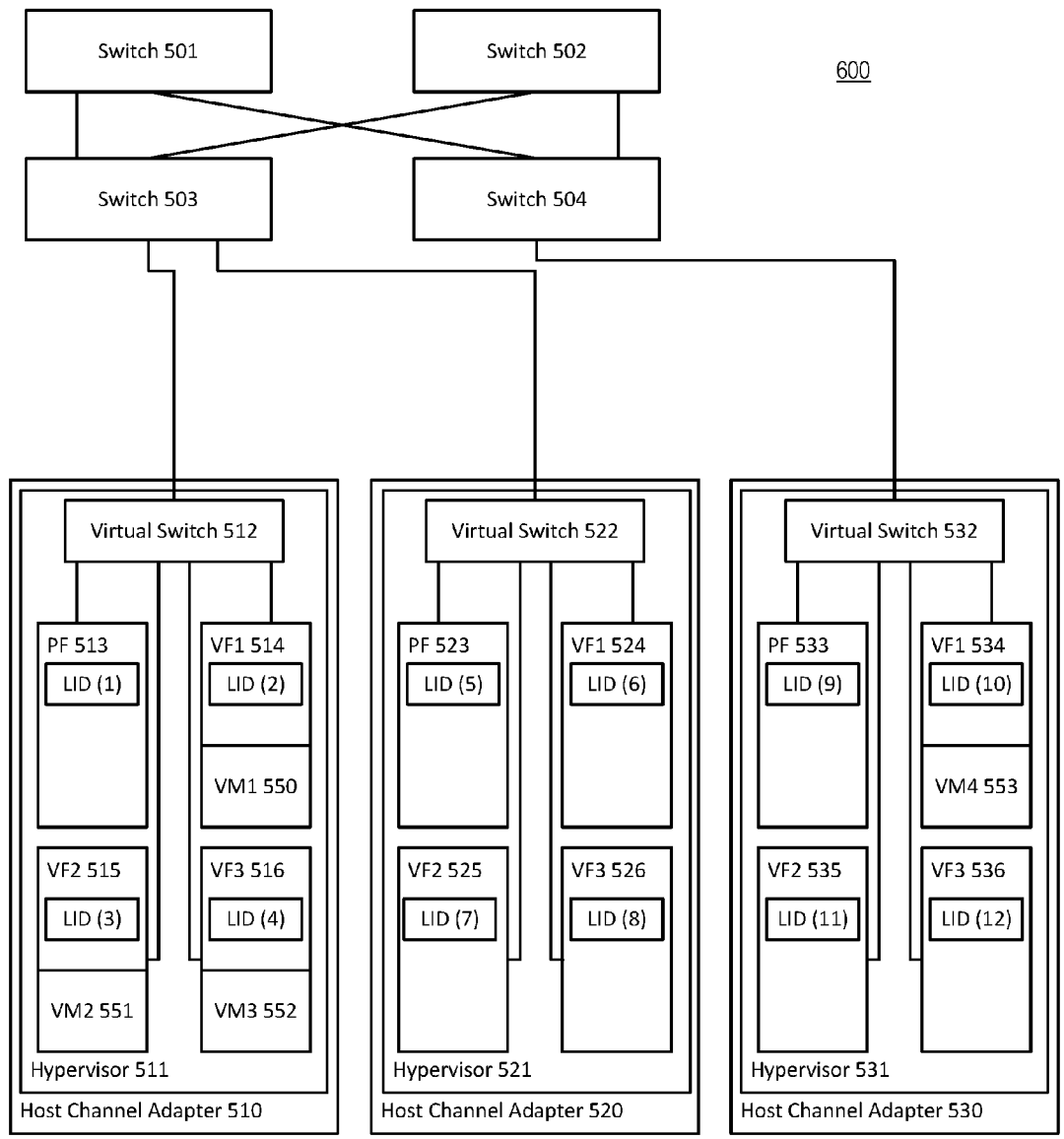
FIG. 7 shows an exemplary vSwitch architecture with prepopulated LIDs, in accordance with an embodiment.

FIG. 7 shows an exemplary vSwitch architecture with prepopulated LIDs, in accordance with an embodiment. As depicted in the figure, a number of switches 501-504 can provide communication within the network switched environment 600 (e.g., an IB subnet) between members of a fabric, such as an InfiniBand fabric. The fabric can include a number of hardware devices, such as host channel adapters 510, 520, 530. Each of the host channel adapters 510, 520, 530, can in turn interact with a hypervisor 511, 521, and 531, respectively. Each hypervisor can, in turn, in conjunction with the host channel adapter it interacts with, setup and assign a number of virtual functions 514, 515, 516, 524, 525, 526, 534, 535, 536, to a number of virtual machines. For example, virtual machine 1 550 can be assigned by the hypervisor 511 to virtual function 1 514. Hypervisor 511 can additionally assign virtual machine 2 551 to virtual function 2 515, and virtual machine 3 552 to virtual function 3 516. Hypervisor 531 can, in turn, assign virtual machine 4 553 to virtual function 1 534. The hypervisors can access the host channel adapters through a fully featured physical function 513, 523, 533, on each of the host channel adapters.

In accordance with an embodiment, each of the switches 501-504 can comprise a number of ports (not shown), which are used in setting a linear forwarding table in order to direct traffic within the network switched environment 600.

In accordance with an embodiment, the virtual switches 512, 522, and 532, can be handled by their respective hypervisors 511, 521, 531. In such a vSwitch architecture each virtual function is a complete virtual Host Channel Adapter (vHCA), meaning that the VM assigned to a VF is assigned a complete set of IB addresses (e.g., GID, GUID, LID) and a dedicated QP space in the hardware. For the rest of the network and the SM (not shown), the HCAs 510, 520, and 530 look like a switch, via the virtual switches, with additional nodes connected to them.

In accordance with an embodiment, the present disclosure provides a system and method for providing a vSwitch architecture with prepopulated LIDs. Referring to FIG. 7, the LIDs are prepopulated to the various physical functions 513, 523, 533, as well as the virtual functions 514-516, 524-526, 534-536 (even those virtual functions not currently associated with an active virtual machine). For example, physical function 513 is prepopulated with LID 1, while virtual function 1 534 is prepopulated with LID 10. The LIDs are prepopulated in an SR-IOV vSwitch-enabled subnet when the network is booted. Even when not all of the VFs are occupied by VMs in the network, the populated VFs are assigned with a LID as shown in FIG. 7.

In accordance with an embodiment, much like physical host channel adapters can have more than one port (two ports are common for redundancy), virtual HCAs can also be represented with two ports and be connected via one, two or more virtual switches to the external IB subnet.

In accordance with an embodiment, in a vSwitch architecture with prepopulated LIDs, each hypervisor can consume one LID for itself through the PF and one more LID for each additional VF. The sum of all the VFs available in all hypervisors in an IB subnet, gives the maximum amount of VMs that are allowed to run in the subnet. For example, in an IB subnet with 16 virtual functions per hypervisor in the subnet, then each hypervisor consumes 17 LIDs (one LID for each of the 16 virtual functions plus one LID for the physical function) in the subnet. In such an IB subnet, the theoretical hypervisor limit for a single subnet is ruled by the number of available unicast LIDs and is: 2891 (49151 available LIDs divided by 17 LIDs per hypervisor), and the total number of VMs (i.e., the limit) is 46256 (2891 hypervisors times 16 VFs per hypervisor). (In actuality, these numbers are actually smaller since each switch, router, or dedicated SM node in the IB subnet consumes a LID as well). Note that the vSwitch does not need to occupy an additional LID as it can share the LID with the PF In accordance with an embodiment, in a vSwitch architecture with prepopulated LIDs, communication paths are computed for all the LIDs the first time the network is booted. When a new VM needs to be started the system does not have to add a new LID in the subnet, an action that would otherwise cause a complete reconfiguration of the network, including path recalculation, which is the most time consuming part. Instead, an available port for a VM is located (i.e., an available virtual function) in one of the hypervisors and the virtual machine is attached to the available virtual function.

In accordance with an embodiment, a vSwitch architecture with prepopulated LIDs also allows for the ability to calculate and use different paths to reach different VMs hosted by the same hypervisor. Essentially, this allows for such subnets and networks to use a LID Mask Control (LMC) like feature to provide alternative paths towards one physical machine, without being bound by the limitation of the LMC that requires the LIDs to be sequential. The freedom to use non-sequential LIDs is particularly useful when a VM needs to be migrated and carry its associated LID to the destination.

In accordance with an embodiment, along with the benefits shown above of a vSwitch architecture with prepopulated LIDs, certain considerations can be taken into account. For example, because the LIDs are prepopulated in an SR-IOV vSwitch-enabled subnet when the network is booted, the initial path computation (e.g., on boot-up) can take longer than if the LIDs were not pre-populated.
InfiniBand SR-IOV Architecture Models—vSwitch with Dynamic LID Assignment In accordance with an embodiment, the present disclosure provides a system and method for providing a vSwitch architecture with dynamic LID assignment.

Figure 8:
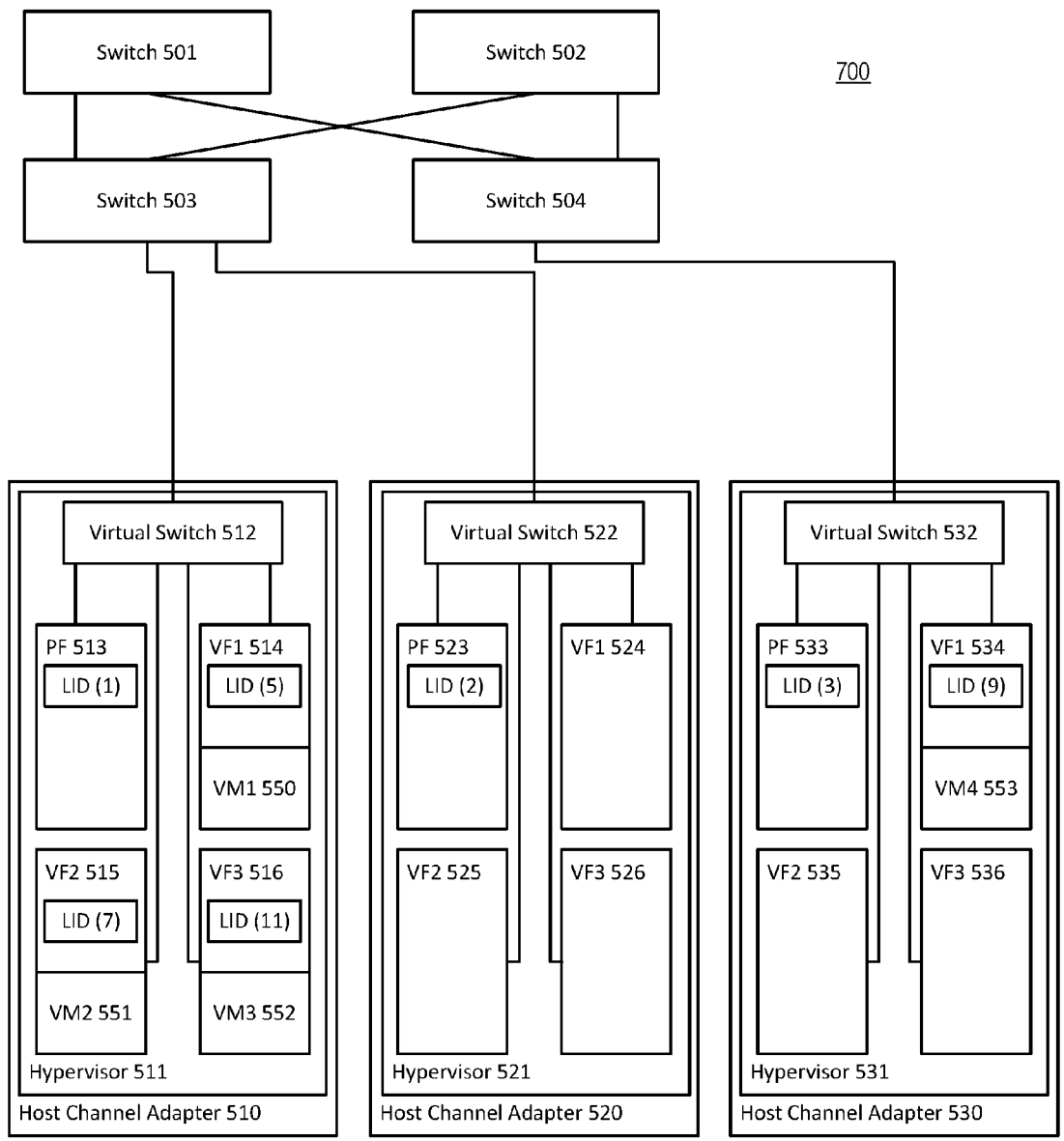
FIG. 8 shows an exemplary vSwitch architecture with dynamic LID assignment, in accordance with an embodiment.

FIG. 8 shows an exemplary vSwitch architecture with dynamic LID assignment, in accordance with an embodiment. As depicted in the figure, a number of switches 501-504 can provide communication within the network switched environment 700 (e.g., an IB subnet) between members of a fabric, such as an InfiniBand fabric. The fabric can include a number of hardware devices, such as host channel adapters 510, 520, 530. Each of the host channel adapters 510, 520, 530, can in turn interact with a hypervisor 511, 521, 531, respectively. Each hypervisor can, in turn, in conjunction with the host channel adapter it interacts with, setup and assign a number of virtual functions 514-516, 524-526, 534-536, to a number of virtual machines. For example, virtual machine 1 550 can be assigned by the hypervisor 511 to virtual function 1 514. Hypervisor 511 can additionally assign virtual machine 2 551 to virtual function 2 515, and virtual machine 3 552 to virtual function 3 516. Hypervisor 531 can, in turn, assign virtual machine 4 553 to virtual function 1 534. The hypervisors can access the host channel adapters through a fully featured physical function 513, 523, 533, on each of the host channel adapters.

In accordance with an embodiment, each of the switches 501-504 can comprise a number of ports (not shown), which are used in setting a linear forwarding table in order to direct traffic within the network switched environment 700.

In accordance with an embodiment, the virtual switches 512, 522, and 532, can be handled by their respective hypervisors 511, 521, 531. In such a vSwitch architecture each virtual function is a complete virtual Host Channel Adapter (vHCA), meaning that the VM assigned to a VF is assigned a complete set of IB addresses (e.g., GID, GUID, LID) and a dedicated QP space in the hardware. For the rest of the network and the SM (not shown), the HCAs 510, 520, and 530 look like a switch, via the virtual switches, with additional nodes connected to them.

In accordance with an embodiment, the present disclosure provides a system and method for providing a vSwitch architecture with dynamic LID assignment. Referring to FIG. 8, the LIDs are dynamically assigned to the various physical functions 513, 523, 533, with physical function 513 receiving LID 1, physical function 523 receiving LID 2, and physical function 533 receiving LID 3. Those virtual functions that are associated with an active virtual machine can also receive a dynamically assigned LID. For example, because virtual machine 1 550 is active and associated with virtual function 1 514, virtual function 514 can be assigned LID 5. Likewise, virtual function 2 515, virtual function 3 516, and virtual function 1 534 are each associated with an active virtual function. Because of this, these virtual functions are assigned LIDs, with LID 7 being assigned to virtual function 2 515, LID 11 being assigned to virtual function 3 516, and LID 9 being assigned to virtual function 1 534. Unlike vSwitch with prepopulated LIDs, those virtual functions 524-526 and 534-536 not currently associated with an active virtual machine do not receive a LID assignment.

In accordance with an embodiment, with the dynamic LID assignment, the initial path computation can be substantially reduced. When the network is booting for the first time and no VMs are present then a relatively small number of LIDs can be used for the initial path calculation and LFT distribution.

In accordance with an embodiment, much like physical host channel adapters can have more than one port (two ports are common for redundancy), virtual HCAs can also be represented with two ports and be connected via one, two or more virtual switches to the external IB subnet.

In accordance with an embodiment, when a new VM is created in a system utilizing vSwitch with dynamic LID assignment, a free VM slot is found in order to decide on which hypervisor to boot the newly added VM, and a unique non-used unicast LID is found as well. However, there are no known paths in the network and the LFTs of the switches for handling the newly added LID. Computing a new set of paths in order to handle the newly added VM is not desirable in a dynamic environment where several VMs may be booted every minute. In large IB subnets, computing a new set of routes can take several minutes, and this procedure would have to repeat each time a new VM is booted.

Advantageously, in accordance with an embodiment, because all the VFs in a hypervisor share the same uplink with the PF, there is no need to compute a new set of routes. It is only needed to iterate through the LFTs of all the physical switches in the network, copy the forwarding port from the LID entry that belongs to the PF of the hypervisor—where the VM is created—to the newly added LID, and send a single SMP to update the corresponding LFT block of the particular switch. Thus the system and method avoids the need to compute a new set of routes.

In accordance with an embodiment, the LIDs assigned in the vSwitch with dynamic LID assignment architecture do not have to be sequential. When comparing the LIDs assigned on VMs on each hypervisor in vSwitch with prepopulated LIDs versus vSwitch with dynamic LID assignment, it is notable that the LIDs assigned in the dynamic LID assignment architecture are non-sequential, while those prepopulated in are sequential in nature. In the vSwitch dynamic LID assignment architecture, when a new VM is created, the next available LID is used throughout the lifetime of the VM. Conversely, in a vSwitch with prepopulated LIDs, each VM inherits the LID that is already assigned to the corresponding VF, and in a network without live migrations, VMs consecutively attached to a given VF get the same LID.

In accordance with an embodiment, the vSwitch with dynamic LID assignment architecture can resolve the drawbacks of the vSwitch with prepopulated LIDs architecture model at a cost of some additional network and runtime SM overhead. Each time a VM is created, the LFTs of the physical switches in the subnet are updated with the newly added LID associated with the created VM. One subnet management packet (SMP) per switch is needed to be sent for this operation. The LMC-like functionality is also not available, because each VM is using the same path as its host hypervisor. However, there is no limitation on the total amount of VFs present in all hypervisors, and the number of VFs may exceed that of the unicast LID limit. Of course, not all of the VFs are allowed to be attached on active VMs simultaneously if this is the case, but having more spare hypervisors and VFs adds flexibility for disaster recovery and optimization of fragmented networks when operating close to the unicast LID limit.

Figure 9:
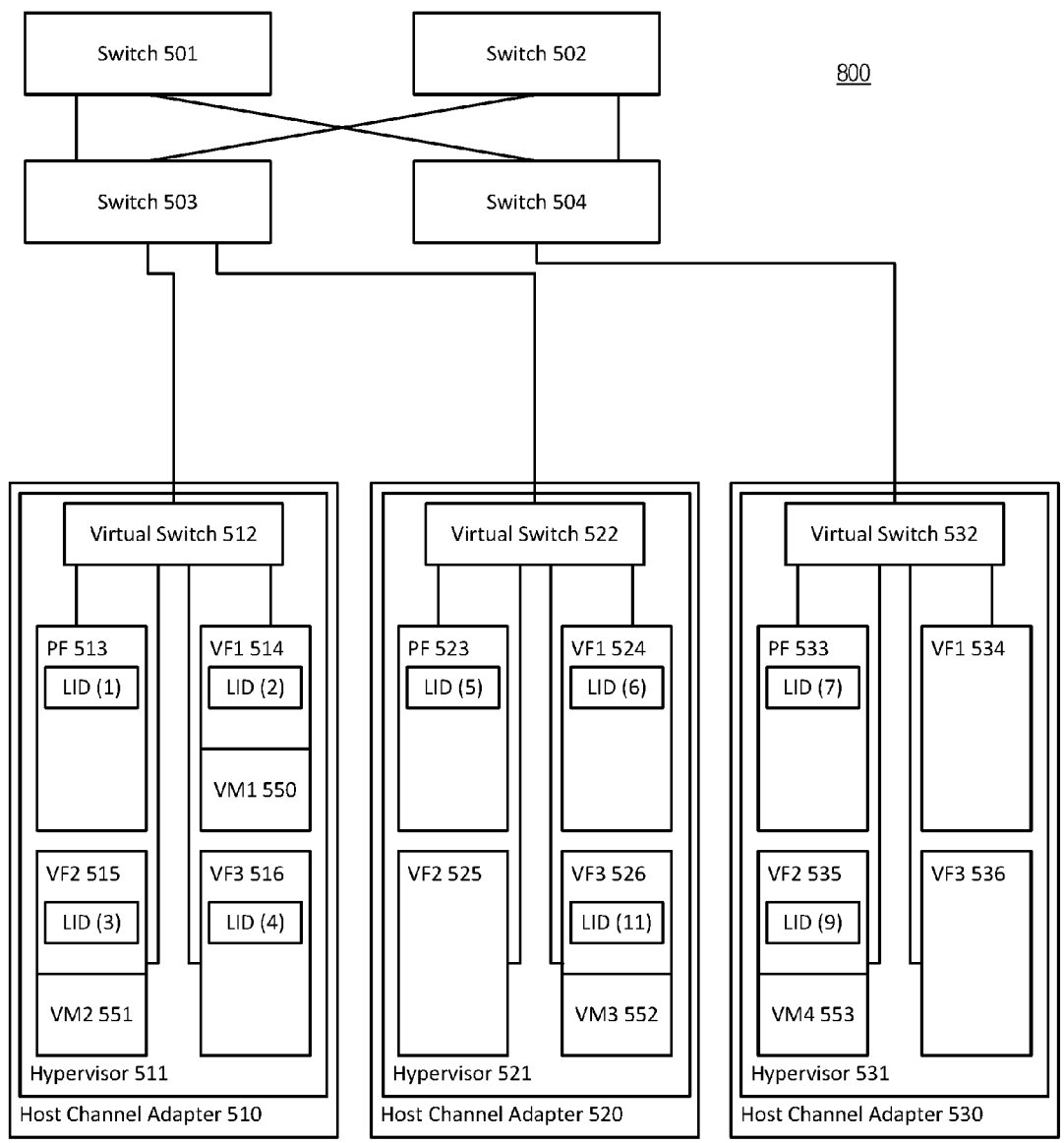
FIG. 9 shows an exemplary vSwitch architecture with vSwitch with dynamic LID assignment and prepopulated LIDs, in accordance with an embodiment.

InfiniBand SR-IOV Architecture Models—vSwitch with Dynamic LID Assignment and Prepopulated LIDs FIG. 9 shows an exemplary vSwitch architecture with vSwitch with dynamic LID assignment and prepopulated LIDs, in accordance with an embodiment. As depicted in the figure, a number of switches 501-504 can provide communication within the network switched environment 800 (e.g., an IB subnet) between members of a fabric, such as an InfiniBand fabric. The fabric can include a number of hardware devices, such as host channel adapters 510, 520, 530. Each of the host channel adapters 510, 520, 530, can in turn interact with a hypervisor 511, 521, and 531, respectively. Each hypervisor can, in turn, in conjunction with the host channel adapter it interacts with, setup and assign a number of virtual functions 514, 515, 516, 524, 525, 526, 534, 535, 536, to a number of virtual machines. For example, virtual machine 1 550 can be assigned by the hypervisor 511 to virtual function 1 514. Hypervisor 511 can additionally assign virtual machine 2 551 to virtual function 2 515. Hypervisor 521 can assign virtual machine 3 552 to virtual function 3 526. Hypervisor 531 can, in turn, assign virtual machine 4 553 to virtual function 2 535. The hypervisors can access the host channel adapters through a fully featured physical function 513, 523, 533, on each of the host channel adapters.

In accordance with an embodiment, each of the switches 501-504 can comprise a number of ports (not shown), which are used in setting a linear forwarding table in order to direct traffic within the network switched environment 800.

In accordance with an embodiment, the virtual switches 512, 522, and 532, can be handled by their respective hypervisors 511, 521, 531. In such a vSwitch architecture each virtual function is a complete virtual Host Channel Adapter (vHCA), meaning that the VM assigned to a VF is assigned a complete set of IB addresses (e.g., GID, GUID, LID) and a dedicated QP space in the hardware. For the rest of the network and the SM (not shown), the HCAs 510, 520, and 530 look like a switch, via the virtual switches, with additional nodes connected to them.

In accordance with an embodiment, the present disclosure provides a system and method for providing a hybrid vSwitch architecture with dynamic LID assignment and prepopulated LIDs. Referring to FIG. 9, hypervisor 511 can be arranged with vSwitch with prepopulated LIDs architecture, while hypervisor 521 can be arranged with vSwitch with prepopulated LIDs and dynamic LID assignment. Hypervisor 531 can be arranged with vSwitch with dynamic LID assignment. Thus, the physical function 513 and virtual functions 514-516 have their LIDs prepopulated (i.e., even those virtual functions not attached to an active virtual machine are assigned a LID). Physical function 523 and virtual function 1 524 can have their LIDs prepopulated, while virtual function 2 and 3, 525 and 526, have their LIDs dynamically assigned (i.e., virtual function 2 525 is available for dynamic LID assignment, and virtual function 3 526 has a LID of 11 dynamically assigned as virtual machine 3 552 is attached). Finally, the functions (physical function and virtual functions) associated with hypervisor 3 531 can have their LIDs dynamically assigned. This results in virtual functions 1 and 3, 534 and 536, are available for dynamic LID assignment, while virtual function 2 535 has LID of 9 dynamically assigned as virtual machine 4 553 is attached there.

In accordance with an embodiment, such as that depicted in FIG. 8, where both vSwitch with prepopulated LIDs and vSwitch with dynamic LID assignment are utilized (independently or in combination within any given hypervisor), the number of prepopulated LIDs per host channel adapter can be defined by a fabric administrator and can be in the range of 0<=prepopulated VFs<=Total VFs (per host channel adapter), and the VFs available for dynamic LID assignment can be found by subtracting the number of prepopulated VFs from the total number of VFs (per host channel adapter).

In accordance with an embodiment, much like physical host channel adapters can have more than one port (two ports are common for redundancy), virtual HCAs can also be represented with two ports and be connected via one, two or more virtual switches to the external IB subnet.

InfiniBand—Inter-Subnet Communication (Fabric Manager)

In accordance with an embodiment, in addition to providing an InfiniBand fabric within a single subnet, embodiments of the current disclosure can also provide for an InfiniBand fabric that spans two or more subnets.

Figure 10:
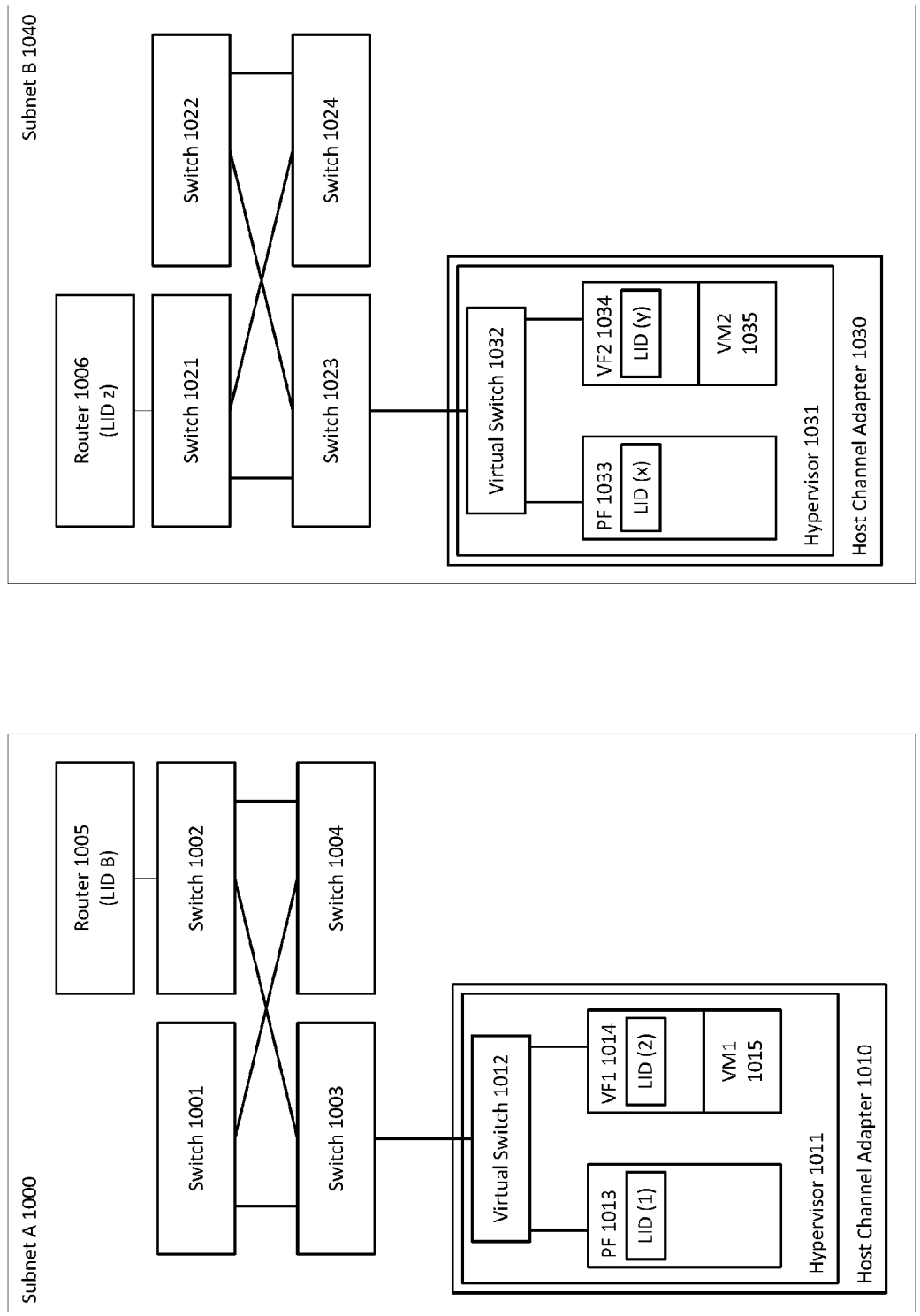
FIG. 10 shows an exemplary multi-subnet InfiniBand fabric, in accordance with an embodiment.

FIG. 10 shows an exemplary multi-subnet InfiniBand fabric, in accordance with an embodiment. As depicted in the figure, within subnet A 1000, a number of switches 1001-1004 can provide communication within subnet A 1000 (e.g., an IB subnet) between members of a fabric, such as an InfiniBand fabric. The fabric can include a number of hardware devices, such as, for example, host channel adapter 1010. Host channel adapter 1010 can in turn interact with a hypervisor 1011. The hypervisor can, in turn, in conjunction with the host channel adapter it interacts with, setup a number of virtual functions 1014. The hypervisor can additionally assign virtual machines to each of the virtual functions, such as virtual machine 1 10105 being assigned to virtual function 1 1014. The hypervisor can access their associated host channel adapters through a fully featured physical function, such as physical function 1013, on each of the host channel adapters. Within subnet B 1040, a number of switches 1021-1024 can provide communication within subnet B 1040 (e.g., an IB subnet) between members of a fabric, such as an InfiniBand fabric. The fabric can include a number of hardware devices, such as, for example, host channel adapter 1030. Host channel adapter 1030 can in turn interact with a hypervisor 1031. The hypervisor can, in turn, in conjunction with the host channel adapter it interacts with, setup a number of virtual functions 1034. The hypervisor can additionally assign virtual machines to each of the virtual functions, such as virtual machine 2 1035 being assigned to virtual function 2 1034. The hypervisor can access their associated host channel adapters through a fully featured physical function, such as physical function 1033, on each of the host channel adapters. It is noted that although only one host channel adapter is shown within each subnet (i.e., subnet A and subnet B), it is to be understood that a plurality of host channel adapters, and their corresponding components, can be included within each subnet.

In accordance with an embodiment, each of the host channel adapters can additionally be associated with a virtual switch, such as virtual switch 1012 and virtual switch 1032, and each HCA can be set up with a different architecture model, as discussed above. Although both subnets within FIG. 10 are shown as using a vSwitch with prepopulated LID architecture model, this is not meant to imply that all such subnet configurations must follow a similar architecture model.

In accordance with an embodiment, at least one switch within each subnet can be associated with a router, such as switch 1002 within subnet A 1000 being associated with router 1005, and switch 1021 within subnet B 1040 being associated with router 1006.

In accordance with an embodiment, at least one device (e.g., a switch, a node . . . etc.) can be associated with a fabric manager (not shown). The fabric manager can be used, for example, to discover inter-subnet fabric topology, created a fabric profile (e.g., a virtual machine fabric profile), build a virtual machine related database objects that forms the basis for building a virtual machine fabric profile. In addition, the fabric manager can define legal inter-subnet connectivity in terms of which subnets are allowed to communicate via which router ports using which partition numbers.

In accordance with an embodiment, when traffic at an originating source, such as virtual machine 1 within subnet A, is addressed to a destination at a different subnet, such as virtual machine 2 within subnet B, the traffic can be addressed to the router within subnet A, i.e., router 1005, which can then pass the traffic to subnet B via its link with router 1006.

Overall, an example embodiment provides a very large fabric with many nodes and, further provides for multiple subnets each having a subnet boundary. The subnet boundaries enable independent subnet managers (SM). In particular, the subnet boundaries enable one independent SM in/for each of the multiple subnets within the very large fabric.

InfiniBand—Q Key Based Resource Access Control

In accordance with an embodiment, in addition to providing an InfiniBand fabric that spans two or more subnets, embodiments of the current disclosure can also provide flexible resource access control within a single partition in a high performance computing environment using enforcement of a value of a Q_Key contained in a packet header is provided in an example embodiment.

Figure 11:
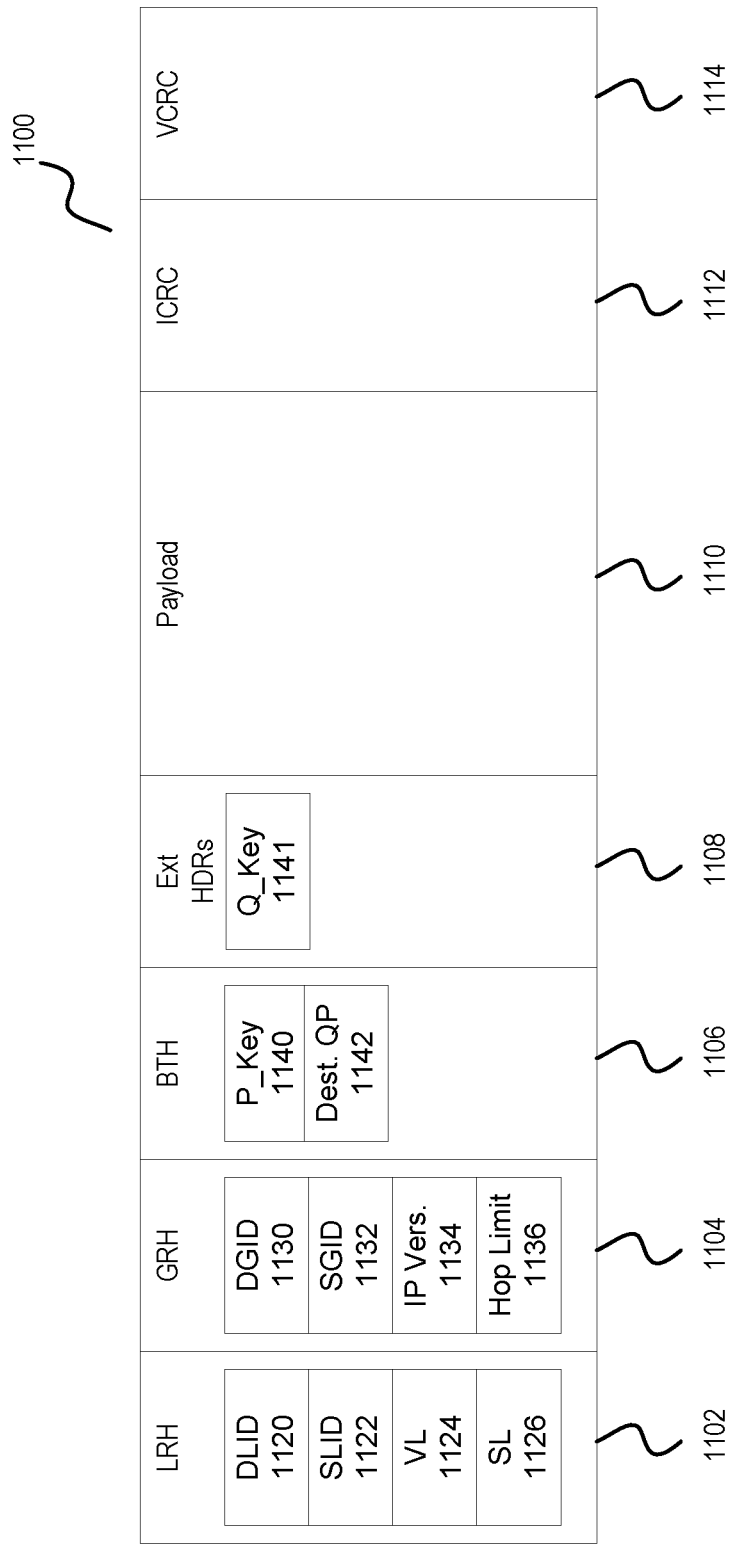
FIG. 11 shows an illustration of a data packet format using InfiniBand (IB) addressing to access a data service or other resource in a network environment, in accordance with an embodiment.

In this regard, FIG. 11 shows an illustration of a data packet format using the InfiniBand (IB) addressing scheme to provide the resource access control in a network environment. In accordance with an embodiment as applied to the InfinBand™ environment, a packet 1100 includes a local route header (LRH) 1102, a global route header (GRH) 1104, a base transport header (BTH) 1106, and an extended transport header (HDR) 1108. The IB packet 1100 also includes payload 1110, invariant cyclic redundancy check 1112 and variant cyclic redundancy check 1114.

With continued reference to FIG. 11, LRH 1102 can contain information such as a destination local identifier (DLID) 1120, a source local identifier (SLID) 1122, a virtual lane (VL) 1124, and a service level (SL) 1126, among other information. The GRH 1104 can contain information such as a destination global identifier (DGID) 1130, a source global identifier (SGID) 1132, an IP version 1134, and a hop limit 1136, among other information. The base transport header BTH 1106 can contain information such as a partition key (P_Key) 1140 and a destination queue pair (Dest. QP) 1142, among other information. The extended transport header 1108 field can contain information such as a reliable datagram extended transport header (DETH), a datagram ETH, and an remote direct memory access (RDMA) ETH (each, not shown), among other information. In the example embodiment, the extended transport header 1108 field contains a queue key (Q_Key) 1141 of the destination queue pair (Dest. QP) 1142.

In accordance with an embodiment, the information contained in the headers of an IB data packet can be used to accept (or deny) an incoming packet as well as to permit (or deny) access to one or more resources and/or data related to the one or more resources using a Resource Table (RT) in combination with the information contained in the headers of the IB data packet in a manner to be described in greater detail below.

In general, however, the partition key (P_Key) 1140, and a queue key (Q_Key) 1141 of a destination queue pair (Dest. QP) 1142 of the base transport header BTH 1106 are used in the example embodiment to accept (or deny) an incoming packet as well as to permit (or deny) access to the one or more resources and/or to the data related to the one or more resources.

The destination queue pair (Dest. QP) 1142 of the base transport header BTH 1106 essentially forms a resource request portion of the header 1100 which in general comprises data identifying a resource request for a requested resource. Similarly, the partition key (P_Key) 1140 and the queue key (Q_Key) 1141 of the base transport header BTH 1106 essentially form a context identification portion of the header 1100 which in general comprises data identifying a context of the resource request.

Access to the controlled resource is selectively allowed within the single partition by: determining the controlled resource based on the data identifying the requested resource; and determining an access right to the controlled resource based on the data identifying the context of the resource request.

Overall then, in the example embodiment, the header portion of a packet received from the network fabric by a physical or virtual end-port associated with a set of one or more resources comprises a header portion including a packet destination queue pair portion comprising data identifying a requested Destination Queue Pair (Dest. QP) as the requested resource. The header portion of the packet received from the network fabric by the server node associated with a set of one or more resources also comprises packet validity and partition identification portions comprising data identifying a validity (Q_Key) of the first packet and a partition (P_Key) of a process requesting the controlled resource.

In the example embodiment, a Resource Table (RT) (FIG. 12, 1200) is provided in a non-transient memory device. The Resource Table 1200 may be provided or otherwise located or disposed at any addressed end-port in the fabric including for example switch management port(s) and/or virtual end-port(s) represented as connected to a switch port but physically implemented by the switch. However, it is to be appreciated that the Resource Table 1200 is not limited to being provided in an addressed end-port in the fabric including for example switch management port(s) and/or virtual end-port(s), and instead may be provided in a network switch. In the example embodiment the RT maps one or more supported Dest. QP values with a corresponding one or more supported Q_Key and P_Key pairs.

Using the RT, access to the controlled resource is selectively denied responsive to determining a non-correspondence between the requested Dest. QP and any of the one or more supported QPs.

In the example embodiment, the requested Dest. QP 1142 is used to index the RT to locate a first supported Q_Key and P_Key pair. Then, access to the controlled resource is also selectively denied responsive to determining a non-correspondence between the Q_Key 1141 of the first packet 1100 and the first supported Q_Key of the located first supported Q_Key and P_Key pair; or determining a non-correspondence between the P_Key of the first packet and the first supported P_Key of the located first supported Q_Key and P_Key pair.

On the other hand, in the example embodiment, access to the controlled resource is selectively allowed responsive to: determining a correspondence between the Q_Key of the first packet and the first supported Q_Key of the located first supported Q_Key and P_Key pair; and determining a correspondence between the P_Key of the first packet and the first supported P_Key of the located first supported Q_Key and P_Key pair.

As noted above, shared services within an InfiniBand™ (IB) fabric can be protected by controlling partition membership for both IB ports representing clients of the shared service as well as IB ports representing providers of the shared service. When a single IB port represents a single resource that each relevant client may access, then it is possible to use a partition membership scheme. In this partition membership scheme, the clients may be limited members of the relevant partition and the provider may be a full member of the relevant partition. In this way, all clients can access the shared resource but they will not be able to communicate between themselves using the relevant partition.

However, when a provider represents a large number of individual resources that each should only be available to a single client or a limited set of clients, as well as when groups of clients require full membership in a partition that is used to access shared resources, then the provider of the shared service will either need to have membership in a large number of partitions and/or it will need to differentiate client access rights using more information that just the partition information in incoming request packets.

Advantageously relative to the above and in accordance with an example embodiment, a Q_Key value part of the IB header is used to identify access rights to a resource. More particularly, for both Unreliable Datagram (UD) as well as Reliable Datagram (RD) based shared services where the wire protocol includes a 32 bit Q_Key value as part of the IB header, then this value can be used to identify access rights to a resource. The resource itself can either be identified by the destination Dest. QP number or via a combination of one or more bit fields from the destination Dest. QP number as well as one or more bit fields from the Q_Key value.

The example embodiment is highly useful for a hardware implementation of IB to Ethernet Gateway resources where each gateway context that represents a set of mapping resources and control structures could be identified by some QP number base value as well as some offset from that base value. The access right to that particular gateway context could then be controlled by the combination of at least one partition key (P_Key) value as well as some value represented by one or more bit fields from the Q_Key value.

However, in order for the Q_Key based access control mechanism to be efficient and in accordance with an example embodiment, the sending IB node is obligated with restrictions in the form of range values or the like for which Q_Key values can be sent. In this regard, the sending node first identifies one or more Q_Key value ranges that are used for resource access control. In addition, the sending node further ensures or otherwise provides a mechanism to ensure that within such ranges only a specific set of access control Q_Key values are used from that particular client port. In this regard and in an example embodiment, a method of resource access control is provided. One or more Q_key value ranges are identified that are used for selectively allowing access to a set of one or more controlled resources. Then, the packet validity and partition identification portions of headers of packets communicated in the single partition are limited to be within the one or more Q_key value ranges that are used for selectively allowing the access to the set of one or more controlled resources.

With this scheme, an example embodiment allows client software operating behind one or more physical or virtual HCA ports to be able to access gateway resources on a large number of gateway nodes and for each such gateway instance be limited to only its designated set of gateway resources based on the Q_Key restrictions imposed by the sending HCA.

At the fabric level and in accordance with a further example embodiment, a mechanism is included wherein only HCAs that support the relevant Q_Key value restriction capabilities would be allowed to be members of partitions where the shared service providers are using Q_Key values to control access to individual resources. The shared resource providers may still provide resource access also for client nodes that are not supporting Q_Key restrictions, but such access uses in accordance with an example embodiment, a different partition than what is used for Q_Key based access control (e.g. just use partition based access control). In this regard and in an example embodiment, a method of resource access control is provided. More particularly, membership in a single partition is limited to only client nodes capable of enforcing request packets having a header comprising packet validity and partition identification portions comprising data identifying the validity (Q_Key) of the packet and a partition (P_Key) relating to the packet requesting the controlled resource.

In accordance with an example embodiment, based on sender controlled Q_Key values, it is also possible to implement flexible schemes where client side HCA nodes and the nodes providing shared gateway services can cooperate on implementing other types of access control or firewall rules in the egress path. Examples of this includes both control of source MAC and VLAN for IB to Ethernet gateway services as well as other aspects of the various wire protocols associated with the gateway.

In this way, a single shared gateway can achieve scalability to a large number of client nodes where each such client node will offload the shared gateway by implementing some of the external wire protocol specific functions that otherwise would need to be implemented by the shared gateway.

On the other hand, a single client HCA can use one or more shared gateways in order to implement a larger set of external wire protocol specific value enforcement or firewall rules than what it is able to implement itself.

By using the Q_Key value to identify what enforcement rules are implemented by the sending/client HCA (if any) as well as what operations (if any) are required by the shared gateway the overall system can be implemented in a scalable way both in terms of the number of clients each shared gateway can support as well as in terms of the number of enforced addresses and access-control/firewall rules that can be supported for each individual client HCA.

Since the Q_Key value used for access control is independent of which client HCA is generating service requests, it is possible to have schemes where Virtual Machine (VM) instances can migrate between different hosts/servers and thereby be associated with different client HCAs at different points in time. The IB addresses associated with the different client HCAs may be different, but as long as the same partition and Q_Key value can be used, the context for this client on the shared service node (e.g. the shared Gateway mode) will not have to be updated.

Figure 12:
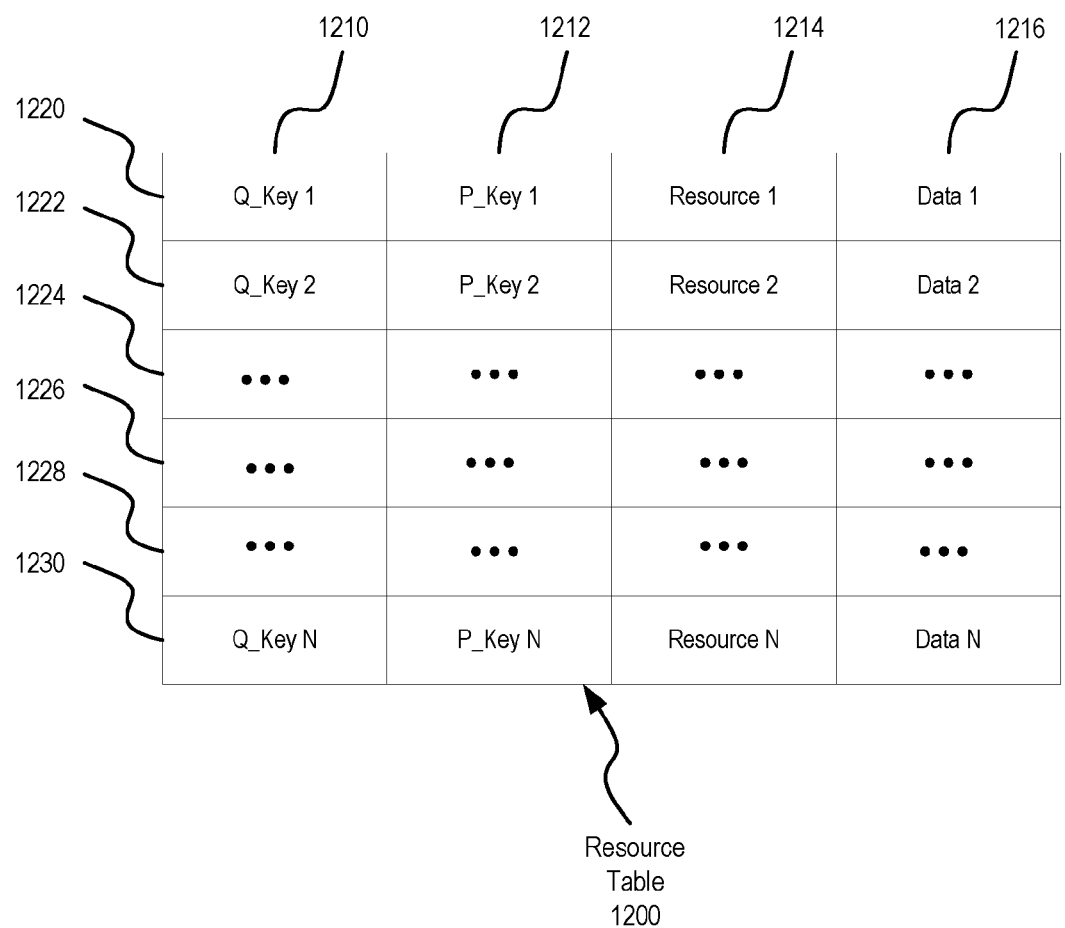
FIG. 12 shows an exemplary portion of a Linear Forwarding Table (LFT) for intra- and inter-subnet forwarding, in accordance with an embodiment.

FIG. 12 shows a block diagram of an exemplary Resource Table (RT) 1200 for Q_Key based access control in accordance with an example embodiment. The RT 1200 is addressable or otherwise indexed using the value contained in the Dest. QP field 1142 of the packet header 1100 shown in FIG. 11. Once so indexed, in accordance with the example embodiment, the values of the P_Key field 1140 and of the Q_Key field 1141 of the IB packet header 1100 are compared against RT 1200 entries contained in the RT 1200 as indexed by the value contained in the Dest. QP field 1142 of the packet header 1100.

For example and with continued reference to FIG. 12, when the value contained in the Dest. QP field 1142 of the packet header 1100 is a first value, the first row 1220 of the RT 1200 is indexed, whereupon the value Q_Key 1 stored in the first column 1210 of the RT 1200 is compared against the value of the Q_Key field 1141 of the IB packet header 1100 and, similarly, the value P_Key 1 stored in the second column 1212 of the RT 1200 is compared against the value of the P_Key field 1140 of the IB packet header 1100. In the example embodiment, access to the Resource 1 and/or the Data 1 operatively relating to the Resource 1 is granted when correspondences or matches are determined between both: i) the value Q_Key 1 stored in the first column 1210 of the RT 1200 and the value of the Q_Key field 1141 of the IB packet header 1100, and ii) the value P_Key 1 stored in the second column 1212 of the RT 1200 and the value of the P_Key field 1140 of the IB packet header 1100.

For further example and with still continued reference to FIG. 12, when the value contained in the Dest. QP field 1142 of the packet header 1100 is a second value, the second row 1222 of the RT 1200 is indexed, whereupon the value Q_Key 2 stored in the first column 1210 of the RT 1200 is compared against the value of the Q_Key field 1141 of the IB packet header 1100 and, similarly, the value P_Key 2 stored in the second column 1212 of the RT 1200 is compared against the value of the P_Key field 1140 of the IB packet header 1100. In the example embodiment, access to the Resource 2 and/or the Data 2 operatively relating to the Resource 2 is granted when correspondences or matches are determined between both: i) the value Q_Key 2 stored in the first column 1210 of the RT 1200 and the value of the Q_Key field 1141 of the IB packet header 1100, and ii) the value P_Key 2 stored in the second column 1212 of the RT 1200 and the value of the P_Key field 1140 of the IB packet header 1100.

For yet a further example and with still continued reference to FIG. 12, when the value contained in the Dest. QP field 1142 of the packet header 1100 is an Nth value, the Nth row 1230 of the RT 1200 is indexed, whereupon the value Q_Key N stored in the first column 1210 of the RT 1200 is compared against the value of the Q_Key field 1141 of the IB packet header 1100 and, similarly, the value P_Key N stored in the second column 1212 of the RT 1200 is compared against the value of the P_Key field 1140 of the IB packet header 1100. In the example embodiment, access to the Resource N and/or the Data N operatively relating to the Resource N is granted when correspondences or matches are determined between both: i) the value Q_Key N stored in the first column 1210 of the RT 1200 and the value of the Q_Key field 1141 of the IB packet header 1100, and ii) the value P_Key N stored in the second column 1212 of the RT 1200 and the value of the P_Key field 1140 of the IB packet header 1100.

As further noted above, in order for the Q_Key based access control mechanism to be efficient and in accordance with an example embodiment, the sending IB node is obligated with restrictions in the form of range values or the like for which Q_Key values can be sent. In this regard, the sending node first identifies one or more Q_Key value ranges that are used for resource access control. In addition, the sending node further ensures or otherwise provides a mechanism to ensure that within such ranges only a specific set of access control Q_Key values are used from that particular client port. In this regard and in accordance with the example embodiment, client/sending HCAs are configured or are otherwise operated to restrict the possible Q_Key values as well as only allowing Q_Key based access control in partitions where all client nodes/HCAs has the Q_Key restriction support described herein.

In the example embodiment, the RT 1200 is addressable or otherwise indexed using the value contained in the Dest. QP field 1142 of the packet header 1100 shown in FIG. 11. Once so indexed, in accordance with the example embodiment, the values of the P_Key field 1140 and of the Q_Key field 1141 of the IB packet header 1100 are compared against RT 1200 entries contained in the RT 1200 as indexed by the value contained in the Dest. QP field 1142 of the packet header 1100. This being the case in the example embodiment, the value of the packet destination queue pair must be within the range of the values of the row indices 1220-1230 for properly indexing the RT 1200. That is, the value contained in the Dest. QP field 1142 of the packet header 1100 must be with the supported range of the row index values 1220-1230. Otherwise, access to the one or more resources Resource 1-Resource N and/or to the data Data 1-Data N operative related to the one or more resources Resource 1-Resource N will be denied.

A second condition for permitting access to the one or more resources Resource 1-Resource N and/or to the data Data 1-Data N operative related to the one or more resources Resource 1-Resource N in accordance with the example embodiment is that a correspondence or a match is determined between the relevant Q_Key value stored in the first column 1210 of the RT 1200 and the value of the Q_Key field 1141 of the IB packet header 1100.

A third condition for permitting access to the one or more resources Resource 1-Resource N and/or to the data Data 1-Data N operative related to the one or more resources Resource 1-Resource N in accordance with the example embodiment is that a correspondence or a match is determined between the relevant P_Key value stored in the second column 1220 of the RT 1200 and the value of the P_Key field 1140 of the IB packet header 1100.

With this scheme, an example embodiment allows client software operating behind one or more physical or virtual HCA ports to be able to access gateway resources on a large number of gateway nodes and for each such gateway instance be limited to only its designated set of gateway resources based on the Q_Key restrictions imposed by the sending HCA.

At the fabric level and in accordance with a further example embodiment, a mechanism is included wherein only HCAs that support the relevant Q_Key value restriction capabilities would be allowed to be members of partitions where the shared service providers are using Q_Key values to control access to individual resources. The shared resource providers may still provide resource access also for client nodes that are not supporting Q_Key restrictions, but such access uses in accordance with an example embodiment, a different partition than what is used for Q_Key based access control (e.g. just use partition based access control).

In accordance with an example embodiment, based on sender controlled Q_Key values, it is also possible to implement flexible schemes where client side HCA nodes and the nodes providing shared gateway services can cooperate on implementing other types of access control or firewall rules in the egress path. Examples of this includes both control of source MAC and VLAN for IB to Ethernet gateway services as well as other aspects of the various wire protocols associated with the gateway.

Figure 13:
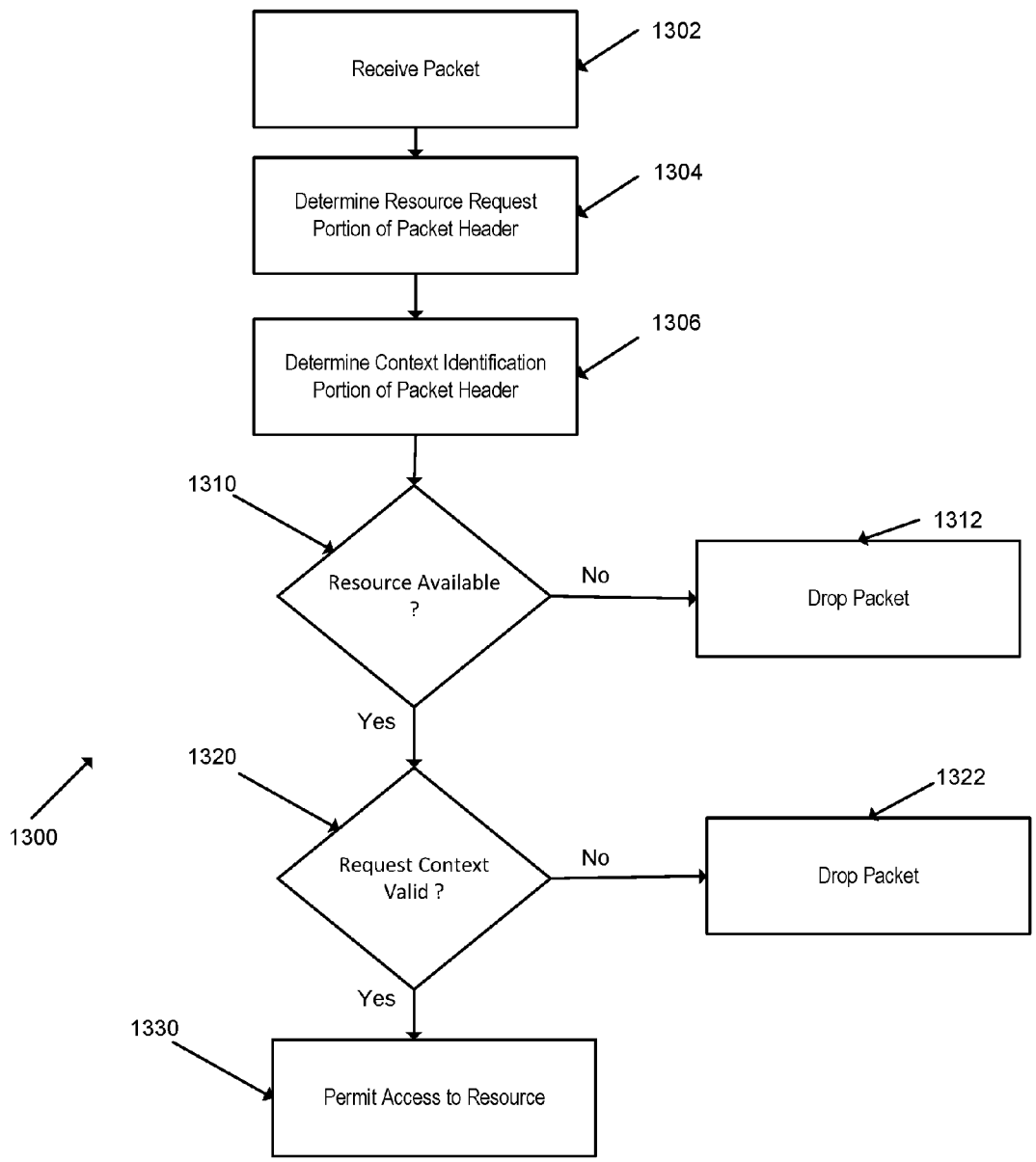
FIG. 13 is a flowchart showing a method in accordance with an example embodiment using packet header value enforcement as a flexible way of providing resource access control within a single partition in a high performance computing environment.

FIG. 13 is a flowchart for a method 1300 in accordance with an example embodiment using packet header value enforcement as a flexible way of providing resource access control within a single partition in a high performance computing environment.

The method 1300 of the example embodiment provides resource access control within a single partition in a network switch environment in a high performance computing environment. The application environment preferably includes a network fabric, one or more subnets, each of the one or more subnets comprising a first network switch wherein the first network switch comprises a plurality of physical ports operatively coupled with a plurality of associated nodes, a processor, and a non-transient memory device storing instructions executable by the processor. In step 1302 a first packet is received from the network fabric. The first packet may be received by the first network switch. However, it is to be appreciated that the first packet is not limited to being received by the first network switch and instead may be received in accordance with the example embodiment by any addressed end-port in the fabric including for example switch management port(s) and/or virtual end-port(s) represented as connected to a switch port but physically implemented by the switch.

The first packet comprises a header portion. From the header portion, a resource request portion is determined at step 1304, and a context identification portion is determined at step 1306. In the example embodiment, the resource request portion of the header portion of the packet comprises data identifying a resource request for a requested resource. Further in the example embodiment, the context identification portion comprises data identifying a context of the resource request.

In step 1310 a controlled resource is determined based on the data identifying the requested resource and, if the controlled resource is indeterminate based on the data identifying the requested resource, the packet is dropped at step 1312 or otherwise ignored and/or disposed of, thereby denying access to the requested resource.

In step 1320 an access right to the controlled resource is determined based on the data identifying the context of the resource request and, if the context of the resource request is improper or otherwise unsupported or the like based on the data identifying the the context of the resource request, the packet is dropped at step 1322 or otherwise ignored and/or disposed of, thereby denying access to the requested resource.

However, access to the controlled resource is allowed in step 1330 when the controlled resource can be determined based on the data identifying the requested resource, and when the access right to the controlled resource can be validated based on the data identifying the context of the resource request.

Figure 14:
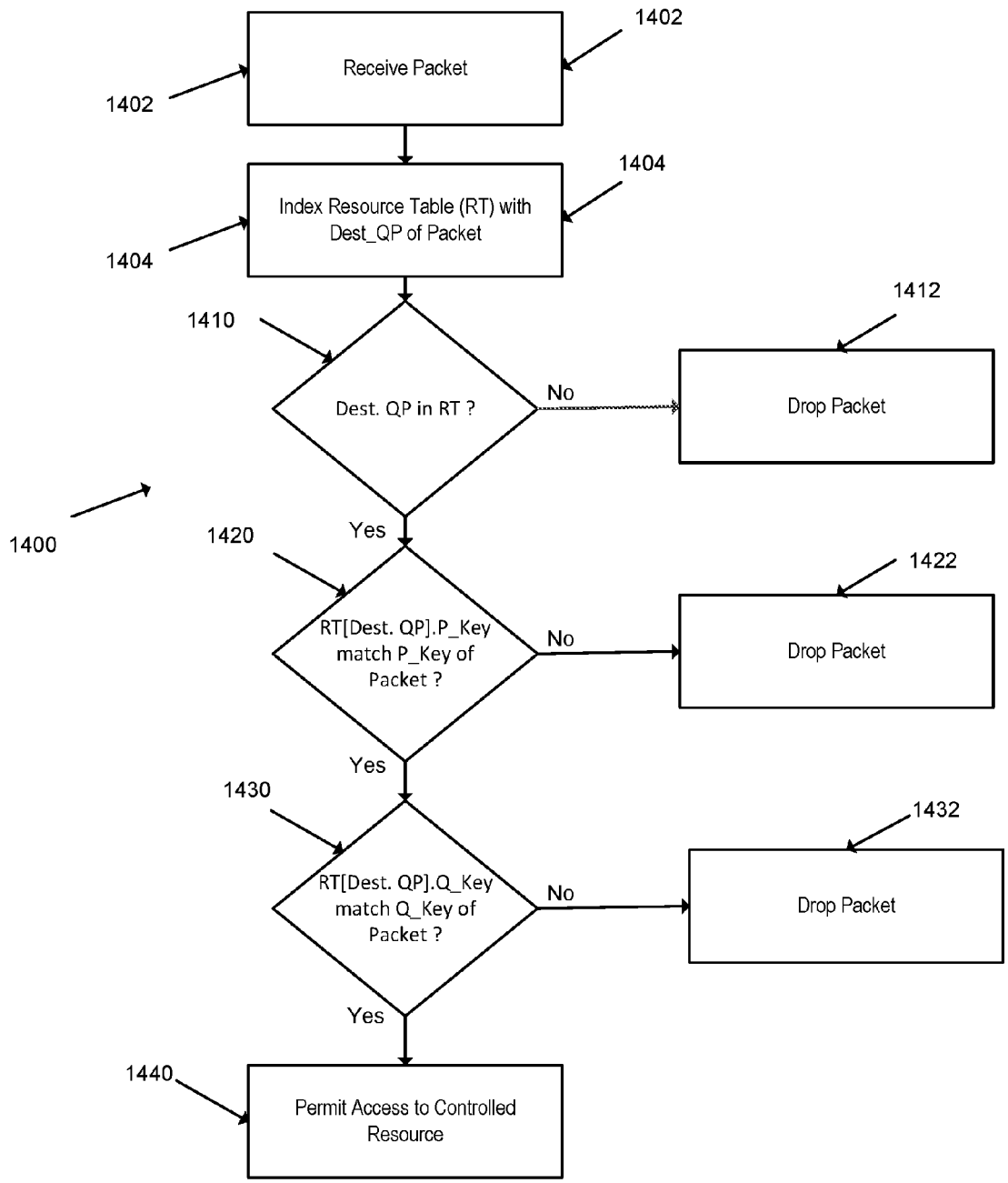
FIG. 14 is a flowchart showing a method in accordance with a further example embodiment using Q_Key value enforcement as a flexible way of providing resource access control within a single partition in a high performance computing environment.

FIG. 14 is a flowchart showing a method 1400 in accordance with a further example embodiment using Q_Key value enforcement as a flexible way of providing resource access control within a single partition in a high performance computing environment.

The method 1400 of the example embodiment provides resource access control within a single partition in a network switch environment in a high performance computing environment. The application environment preferably includes a network fabric, one or more subnets, each of the one or more subnets comprising a first network switch wherein the first network switch comprises a plurality of physical ports operatively coupled with a plurality of associated nodes, a processor, and a non-transient memory device storing instructions executable by the processor.

In step 1402 a first packet is received from the network fabric. The first packet may be received by the first network switch. However, it is to be appreciated that the first packet is not limited to being received by the first network switch and instead may be received in accordance with the example embodiment by any addressed end-port in the fabric including for example switch management port(s) and/or virtual end-port(s) represented as connected to a switch port but physically implemented by the switch. The first packet comprises a header portion. From the header portion, a resource request portion is determined, and a context identification portion is determined. In the example embodiment, the resource request portion of the header portion of the packet comprises data identifying a resource request for a requested resource. Further in the example embodiment, the context identification portion comprises data identifying a context of the resource request. The portion of the header identifying the requested resource includes a packet destination queue pair portion comprising data identifying a requested Destination Queue Pair (Dest. QP) as the requested resource. The portion of the header including the packet validity and partition identification information includes in the example embodiment data identifying a validity (Q_Key) of the first packet and a partition (P_Key) relating to the packet requesting the controlled resource.

In step 1404 the requested Dest. QP is used to index a Resource Table (RT) 1200 stored in the non-transient memory device of the first network switch. In the example embodiment, the RT 1200 maps one or more supported Dest. QP values with a corresponding one or more supported Q_Key and P_Key pairs. The requested Dest. QP is used to index the RT 1200 in step 1404 to locate a first supported Q_Key and P_Key pair.

An ability to index the RT using the Dest. QP is determined in step 1410. Access to the controlled resource is selectively denied responsive to determining a non-correspondence between the requested Dest. QP and any of the one or more supported QPs. If the controlled resource is indeterminate based on the data identifying the requested resource using the requested Dest. QP and the available set of indexes into the RT, the packet is dropped at step 1412 or otherwise ignored and/or disposed of, thereby denying access to the requested resource.

In steps 1420 and 1430 an access right to the controlled resource is determined based on the data identifying the context of the resource request and, if the context of the resource request is improper or otherwise unsupported or the like based on the data identifying the context of the resource request, the packet is dropped at steps 1422 and/or 1432 or otherwise ignored and/or disposed of, thereby denying access to the requested resource. More particularly and in connection with the example embodiment, a correspondence between the P_Key of the first packet and the first supported P_Key of the located first supported Q_Key and P_Key pair is determined at step 1420. If the P_Key of the first packet does not match the first supported P_Key of the located first supported Q_Key and P_Key pair, the packet is dropped at step 1422 or otherwise ignored and/or disposed of, thereby denying access to the requested resource. Similarly, a correspondence between the Q_Key of the first packet and the first supported Q_Key of the located first supported Q_Key and P_Key pair is determined at step 1430. If the Q_Key of the first packet does not match the first supported Q_Key of the located first supported Q_Key and P_Key pair, the packet is dropped at step 1432 or otherwise ignored and/or disposed of, thereby denying access to the requested resource.

However, access to the controlled resource is allowed in step 1440 when the controlled resource can be determined based on the data identifying the requested resource, and when the access right to the controlled resource can be validated based on the data identifying the context of the resource request.

Features of the example embodiments can be implemented in, using, or with the assistance of a computer program product which is a storage medium (media) or computer readable medium (media) having instructions stored thereon/in which can be used to program a processing system to perform any of the features presented herein. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

Stored on any one of the machine readable medium (media), features of the example embodiments can be incorporated in software and/or firmware for controlling the hardware of a processing system, and for enabling a processing system to interact with other mechanism utilizing the results of the example embodiments. Such software or firmware may include, but is not limited to, application code, device drivers, operating systems and execution environments/containers.

Features of the example embodiment may also be implemented in hardware using, for example, hardware components such as application specific integrated circuits (ASICs). Implementation of the hardware state machine so as to perform the functions described herein will be apparent to persons skilled in the relevant art.

Additionally, example embodiments may be conveniently implemented using one or more conventional general purpose or specialized digital computer, computing device, machine, or microprocessor, including one or more processors, memory and/or computer readable storage media programmed according to the teachings of the present disclosure. Appropriate software coding can readily be prepared by skilled programmers based on the teachings of the present disclosure, as will be apparent to those skilled in the software art.

While various embodiments have been described above, it should be understood that they have been presented by way of example, and not limitation. It will be apparent to persons skilled in the relevant art that various changes in form and detail can be made therein without departing from the spirit and scope of the invention.

The example embodiments have been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the claimed invention.

The foregoing description of example embodiments have been provided for the purposes of illustration and description. It is not intended to be exhaustive or to limit the invention to the precise forms disclosed. The breadth and scope of the example embodiments should not be limited by any of the above-described exemplary embodiments. Many modifications and variations will be apparent to the practitioner skilled in the art. The modifications and variations include any relevant combination of the disclosed features. The embodiments were chosen and described in order to best explain the principles of the claimed invention and its practical application, thereby enabling others skilled in the art to understand the claimed invention for various embodiments and with various modifications that are suited to the particular use contemplated. It is intended that the scope of the claimed invention be defined by the following claims and their equivalents.

The invention claimed is:

1. A method of resource access control within a single partition in a network switch environment in a high performance computing environment, the method comprising:
   providing, at a computer environment including a network, one or more subnets, each of the one or more subnets comprising a first network switch wherein the first network switch comprises a plurality of physical ports operatively coupled with a plurality of associated nodes, a processor, and a non-transient memory device storing instructions executable by the processor;
   receiving a first packet from the network fabric by a physical or virtual end-port associated with a set of one or more resources, the first packet comprising a header portion including a resource request portion comprising data identifying a resource request for a requested controlled resource of the set of one or more resources, and a context identification portion comprising data identifying a context of the resource request;
   providing a Resource Table (RT) in a non-transient memory device of the first network switch, the RT mapping a plurality of input table pointers to a corresponding plurality of supported contexts;
   using the RT, mapping the resource request of the first packet to a first supported context in the RT;
   determining an allowed access to the requested controlled resource within the single partition by:
      determining a correspondence between the first supported context of the RT based on the mapping and the context of the resource request of the first packet; and
      determining the allowed access based on the correspondence between the first supported context of the RT based on the mapping and the context of the resource request; and
   accessing the requested controlled resource based on the determined allowed access by routing the first packet to the requested controlled resource using the resource request and the context identification portions of the header portion of the first packet.

2. The method of resource access control according to claim 1, wherein the receiving the first packet comprises:
   receiving from the network fabric by the physical or virtual end-port a first packet comprising a header portion including a packet destination queue pair portion comprising data identifying a requested Destination Queue Pair (Dest. QP) associated with the physical or virtual end-port as the requested resource, and packet validity and partition identification portions comprising data identifying a validity (Q_Key) of the first packet and a partition (P_Key) relating to the first packet requesting the controlled resource.

3. The method of resource access control according to claim 2, wherein:
   the providing the RT comprises providing an RT mapping one or more supported Dest. QP values with a corresponding one or more supported Q_Key and P_Key pairs; and
   the accessing the requested controlled resource comprises accessing the requested controlled resource by routing the first packet to the requested controlled resource using the P_Key and the Dest. QP of the first packet.

4. The method of resource access control according to claim 3, further comprising:
   selectively denying the access to the controlled resource responsive to determining a non-correspondence between the requested Dest. QP and any of the one or more supported Dest. QPs.

5. The method of resource access control according to claim 4, further comprising:
   using the requested Dest. QP, indexing the RT to locate a first supported Q_Key and P_Key pair;
   selectively allowing the access to the controlled resource responsive to:
      determining a correspondence between the Q_Key of the first packet and the first supported Q_Key of the located first supported Q_Key and P_Key pair; and
      determining a correspondence between the P_Key of the first packet and the first supported P_Key of the located first supported Q_Key and P_Key pair; and
   selectively denying the access to the controlled resource responsive to:
      determining a non-correspondence between the Q_Key of the first packet and the first supported Q_Key of the located first supported Q_Key and P_Key pair; or
      determining a non-correspondence between the P_Key of the first packet and the first supported P_Key of the located first supported Q_Key and P_Key pair.

6. The method of resource access control according to claim 5, further comprising:
   selectively allowing access to data corresponding to the controlled resource responsive to:
      determining a match between the Q_Key of the first packet and the first supported Q_Key of the located first supported Q_Key and P_Key pair; and
      determining a match between the P_Key of the first packet and the first supported P_Key of the located first supported Q_Key and P_Key pair; and
   selectively dropping the first packet requesting the controlled resource responsive to:
      determining the non-correspondence between the Q_Key of the first packet and the first supported Q_Key of the located first supported Q_Key and P_Key pair; or
      determining the non-correspondence between the P_Key of the first packet and the first supported P_Key of the located first supported Q_Key and P_Key pair.

7. The method of resource access control according to claim 4, further comprising:
   identifying one or more Q_key value ranges that are used for selectively allowing access to the set of one or more controlled resources; and
   limiting the packet validity and partition identification portions of headers of packets communicated in the single partition to be within the one or more Q_key value ranges that are used for selectively allowing the access to the set of one or more controlled resources.

8. The method of resource access control according to claim 2, further comprising:
   restricting membership in the single partition to only client nodes capable of enforcing request packets having a header comprising packet validity and partition identification portions comprising data identifying the validity (Q_Key) of the packet and a partition (P_Key) relating to the packet requesting the controlled resource.

9. A system providing resource access control within a single partition in a network switch environment in a high performance computing environment, the system comprising:
   a first subnet in an associated computer environment including a network fabric, the first subnet comprising:

a first network switch wherein the first network switch comprises:
  a plurality of physical ports operatively coupled with a plurality of associated nodes;
  a non-transient memory device;
  logic stored in the non-transient memory device; and
  a processor configured to execute the logic,
wherein a first packet is received from the network fabric by a physical or virtual end-port associated with a set of one or more resources, the first packet comprising a header portion including a resource request portion comprising data identifying a resource request for a requested controlled resource of the set of one or more resources, and a context identification portion comprising data identifying a context of the resource request,
wherein a Resource Table (RT) is provided in a non-transient memory device of the first network switch, the RT mapping a plurality of input table pointers to a corresponding plurality of supported contexts,
wherein the RT is used to map the resource request of the first packet to a first supported context in the RT,
wherein an allowed access to the requested controlled resource within the single partition is determined by:
  determining a correspondence between the first supported context of the RT based on the mapping and the context of the resource request of the first packet; and
  determining the allowed access based on the data identifying correspondence between the first supported context of the RT based on the mapping and the context of the resource request,
wherein the requested controlled resource is accessed based on the determined allowed access by routing the first packet to the requested controlled resource using the resource request and the context identification portions of the header portion of the first packet.

10. The system providing resource access control according to claim 9, wherein the first packet is received from the network fabric by the physical or virtual end-port of the server node, the first packet comprising a header portion including a packet destination queue pair portion comprising data identifying a requested Destination Queue Pair (Dest. QP) as the requested resource, and packet validity and partition identification portions comprising data identifying a validity (Q_Key) of the first packet and a partition (P_Key) of a process requesting the controlled resource.

11. The system providing resource access control according to claim 10, wherein:
  RT provdes an RT mapping of one or more supported Dest. QP values with a corresponding one or more supported Q_Key and P_Key pairs; and
  the accessing the requested controlled resource comprises accessing the requested controlled resource by routing the first packet to the requested controlled resource using the P_Key and the Dest. QP of the first packet.

12. The system providing resource access control according to claim 11, wherein:
  access to the controlled resource is selectively denied responsive to determining a non-correspondence between the requested Dest. QP and any of the one or more supported Dest. QPs.

13. The system providing resource access control according to claim 12, wherein:
  the requested Dest. QP is used to index the RT to locate a first supported Q_Key and P_Key pair;
  the access to the controlled resource is selectively allowed responsive to:
    determining a correspondence between the Q_Key of the first packet and the first supported Q_Key of the located first supported Q_Key and P_Key pair; and
    determining a correspondence between the P_Key of the first packet and the first supported P_Key of the located first supported Q_Key and P_Key pair; and
  the access to the controlled resource is selectively denied responsive to:
    determining a non-correspondence between the Q_Key of the first packet and the first supported Q_Key of the located first supported Q_Key and P_Key pair; or
    determining a non-correspondence between the P_Key of the first packet and the first supported P_Key of the located first supported Q_Key and P_Key pair.

14. The system providing resource access control according to claim 13, wherein:
  the access to data corresponding to the controlled resource is selectively allowed responsive to:
    determining a match between the Q_Key of the first packet and the first supported Q_Key of the located first supported Q_Key and P_Key pair; and
    determining a match between the P_Key of the first packet and the first supported P_Key of the located first supported Q_Key and P_Key pair; and
  the first packet requesting the controlled resource is selectively dropped responsive to:
    determining the non-correspondence between the Q_Key of the first packet and the first supported Q_Key of the located first supported Q_Key and P_Key pair; or
    determining the non-correspondence between the P_Key of the first packet and the first supported P_Key of the located first supported Q_Key and P_Key pair.

15. The system providing resource access control according to claim 11, further comprising:
  identifying one or more Q_key value ranges that are used for selectively allowing access to the set of one or more controlled resources; and
  limiting the packet validity and partition identification portions of headers of packets communicated in the single partition to be within the one or more Q_key value ranges that are used for selectively allowing the access to the set of one or more controlled resources.

16. The system providing resource access control according to claim 10, further comprising:
  restricting membership in the single partition to only client nodes capable of enforcing request packets having a header comprising packet validity and partition identification portions comprising data identifying the validity (Q_Key) of the packet and a partition (P_Key) relating to the packet requesting the controlled resource.

17. A non-transitory machine readable medium having instructions stored thereon that when executed by an associated computer comprising a network fabric and a first subnet cause the associated computer to perform resource access control steps within a single partition comprising:
  providing, at a computer environment including a network, one or more subnets, each of the one or more subnets comprising a first network switch wherein the first network switch comprises a plurality of physical ports operatively coupled with a plurality of associated nodes, a processor, and a non-transient memory device storing instructions executable by the processor;
  receiving a first packet from the network fabric by a physical or virtual end-port associated with a set of one or more resources, the first packet comprising a header portion including a resource request portion comprising data identifying a resource request for a requested controlled resource of the set of one or more resources, and a context identification portion comprising data identifying a context of the resource request;

providing a Resource Table (RT) in a non-transient memory device of the first network switch, the RT mapping a plurality of input table pointers to a corresponding plurality of supported contexts;

using the RT, mapping the resource request of the first packet to a first supported context in the RT:

determining an allowed access to the requested controlled resource within the single partition by:
  determining a correspondence between the first supported context of the RT based on the mapping and the context of the resource request of the first packet; and
  determining the allowed access based on the correspondence between the first supported context of the RT based on the mapping and the context of the resource request; and accessing the requested controlled resource based on the determined allowed access by routing the first packet to the requested controlled resource using the resource request and the context identification portions of the header portion of the first packet.

18. The non-transitory machine readable medium according to claim 17, wherein the receiving the first packet comprises:

receiving from the network fabric by the physical or virtual end-port a first packet comprising a header portion including a packet destination queue pair portion comprising data identifying a requested Destination Queue Pair (Dest. QP) associated with the physical or virtual end-port as the requested resource, and packet validity and partition identification portions comprising data identifying a validity (Q_Key) of the first packet and a partition (P_Key) relating to the first packet requesting the controlled resource.

19. The non-transitory machine readable medium according to claim 18, wherein:

the providing the RT comprises providing an RT mapping one or more supported Dest. QP values with a corresponding one or more supported Q_Key and P_Key pairs and the accessing the requested controlled resource comprises accessing the requested controlled resource by routing the first packet to the requested controlled resource using the P_Key and the Dest. QP of the first packet.

20. The non-transitory machine readable medium according to claim 19, further comprising:

selectively denying the access to the controlled resource responsive to determining a non-correspondence between the requested Dest. QP and any of the one or more supported Dest. QPs.

* * * * *

UNITED STATES PATENT AND TRADEMARK OFFICE
CERTIFICATE OF CORRECTION

PATENT NO. : 10,284,448 B2
APPLICATION NO. : 15/416709
DATED : May 7, 2019
INVENTOR(S) : Johnsen et al.

Page 1 of 1

It is certified that error appears in the above-identified patent and that said Letters Patent is hereby corrected as shown below:

In the Specification

In Column 1, Line 33, delete "15/146,696" and insert -- 15/416,696 --, therefor.

Signed and Sealed this
Twelfth Day of May, 2020

Andrei Iancu
*Director of the United States Patent and Trademark Office*